United States Patent [19]
Satoh et al.

[11] Patent Number: 5,801,648
[45] Date of Patent: Sep. 1, 1998

[54] DATA COMPRESSING METHOD, DATA COMPRESSING APPARATUS, DATA DECOMPRESSING METHOD AND DATA DECOMPRESSING APPARATUS

[75] Inventors: Noriko Satoh; Yoshiyuki Okada; Shigeru Yoshida; Hironori Yahagi, all of Kawasaki, Japan

[73] Assignee: Fujitsu Limited, Kawasaki, Japan

[21] Appl. No.: 574,436

[22] Filed: Dec. 15, 1995

[30] Foreign Application Priority Data

Feb. 21, 1995 [JP] Japan ................................ 7-032597
Oct. 19, 1995 [JP] Japan ................................ 7-271577

[51] Int. Cl.$^6$ ........................................................ H03M 7/30
[52] U.S. Cl. ................................................ 341/50; 341/79
[58] Field of Search .............................. 341/79, 50, 87, 341/106, 67

[56] References Cited

U.S. PATENT DOCUMENTS 4,672,679 6/1987 Freeman .................................. 382/40
5,254,990 10/1993 Yoshida et al. ......................... 341/51

Primary Examiner—Jeffrey A. Gaffin
Assistant Examiner—Peguy Jean-Pierre
Attorney, Agent, or Firm—Staas & Halsey

[57] ABSTRACT

A data compressing method involves the use of a data string registering unit for registering a charactor or charactor string and the context and a code information registering unit for registering coding information of the character or character string following the context, the coding information following previous a input data. The data compressing method includes a data string new registering step of, when the input character or character string and the context set is not registering in the string registering unit, register the set in the data string registering unit. The same method also includes a code information new registering step of, when the input character or character string's code information following the context is not registering in the code information registering unit, register the code information in the code information registering unit and a code outputting step of outputting the code following the code information registered in the code information registering unit and a code information updating step of updating the code information registering unit.

44 Claims, 31 Drawing Sheets

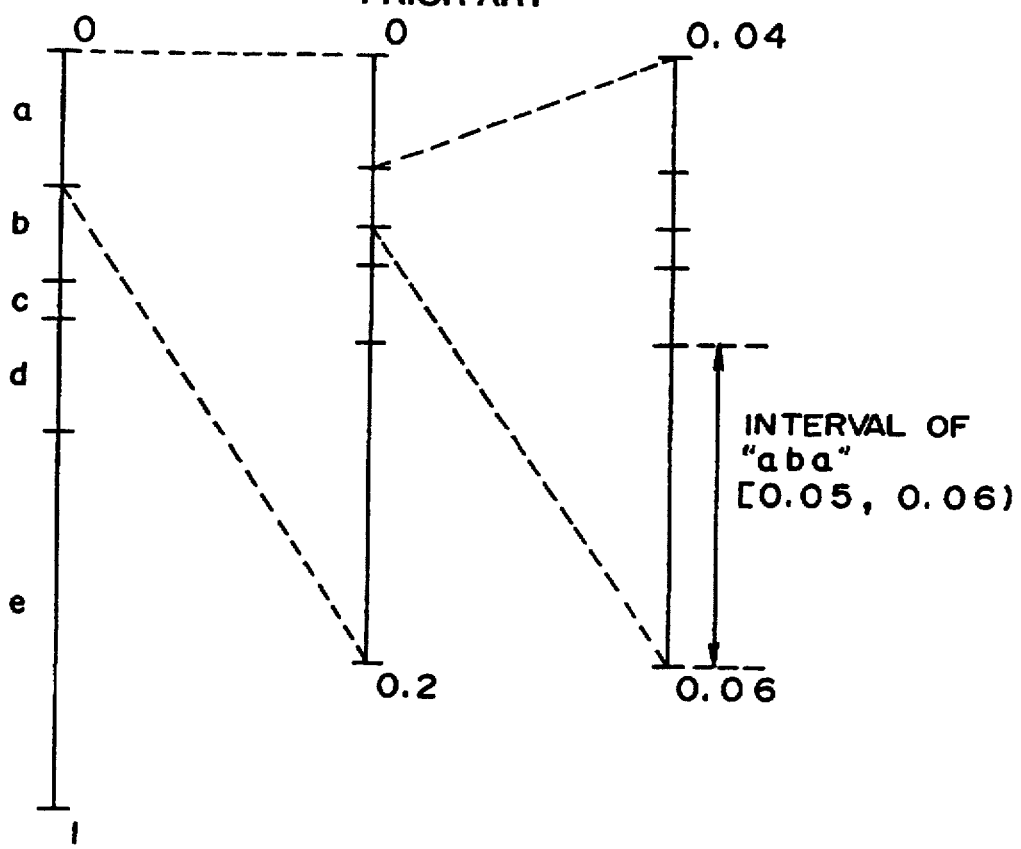

SEQUENCE OF FREQUENCIES

RISE ORDER OF ELEMENT APPEARED LATEST (1)

RISE ORDER OF ELEMENT APPEARED LATEST (2)

FIG. 16
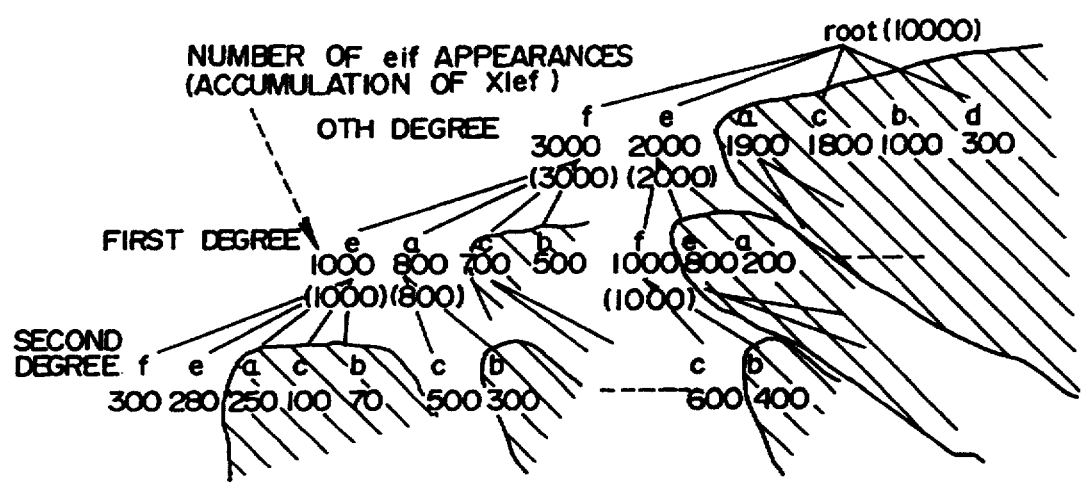
↓ PARTIAL DELETION & UPDATING
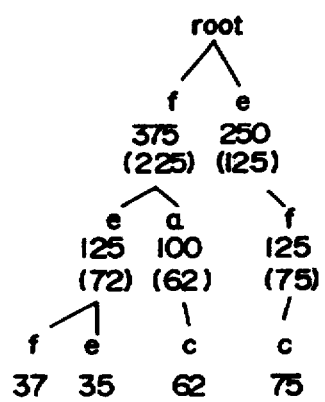

| CODE NUMBER | CHARACTER STRING | CODE TREE ROOT CORRESPONDING TO SECOND CODING (DECODING) PROCESS TARGET CONTEXT INDICATED BY NODE | CODE TREE ROOT CORRESPONDING TO CODING (DECODING) PROCESS TARGET CONTEXT DEFINED AS PARENT OF NODE |
|---|---|---|---|
| 6 | B A | IROOT (B A) | IROOT (B) |
| 8 | B A B | 0 | IROOT (B A) |

DATA COMPRESSING METHOD, DATA COMPRESSING APPARATUS, DATA DECOMPRESSING METHOD AND DATA DECOMPRESSING APPARATUS

BACKGROUND OF THE INVENTION

The present invention relates to a data compressing method, a data decompressing method, a data decompressing apparatus and a data decompressing apparatus. The data decompressing method, the data decompressing method, the data decompressing apparatus and the data decompressing apparatus according to the present invention are effective in equipments with no allowance in memory.

In recent years, a computer has dealt with a variety of data such as character codes, video data, etc., and, correspondingly, a quantity of the data dealt with has rapidly increased. In the case of dealing with a large quantity of data, the data quantity is compressed by omitting redundant parts of the data. With this compression, it is possible to reduce a storage capacity and transmit the data fast.

Herein, a universal coding method is proposed as a method capable of decompressing the data irrespective of the kinds of the data. The universal coding method is classified into a method making use of a similarity in data sequences and a statistical coding method making use of an occurrence frequency of a data string. Then, the statistical coding method is compressed of probability holding part and estropy coding part. Context model, blending model and so on are given as examples of the former methods, while arithmetic coding, splay coding and so on are given a examples of the latter methods.

Hereinafter, the arithmetic coding method, the splay coding method and the blending splay coding method will be described. Note that one-word unit data is called a character (alphabet), and pieces of data linked based on an arbitrary word unit is referred to as a character string in this specification.

(Arithmetic Coding Method)

The arithmetic coding method is defined as a coding method capable of compressing at a maximum efficiency if an occurrence frequency of a character of a information source is already known. The arithmetic coding method is further subclassified into a method of performing arithmetic coding with a binary value (binary arithmetic coding method) and a method of performing arithmetic coding with a ternary or more value (multivalued arithmetic coding method, (refer to e.g., "Arithmetic Coding for Data Compression" written by IAN H. WITTEN et al., Commun. of ACM Vol. 130 No. 6 pp. 520–540, "An Adaptive Dependency Source Model for Data Compression Scheme" written by D. M. ABRAHAMSON, Commun. of ACM, Vol. 132 No. 1 pp. 77–83)

Hereinafter, a concept of the multialphabet arithmetic coding in principle will be explained with reference to FIG. 1. Herein, it is assumed that a character string "abc" be subjected to the multialphabet arithmetic coding. However, the characters which will occur may be "c" and "d" in addition to "a", "b" and "e".

To begin with, a number line $0 \leq P < 1$ ([0,1)) is segmented based on the following conditions 1) and 2).

Condition 1): Each interval formed by the segmentation is made corresponding to each character.

Condition 2): A length of each interval is made proportional to an occurrence frequency of the corresponding character.

In the case of FIG. 1(a), the occurrence frequencies of the characters "a", "b", "c", "d" and "e" are respectively 0.20, 0.10, 0.05, 0.15 and 0.50. Hence, the number line [0, 1) is segmented so that an interval corresponding to "e" is the largest as seen in the number line positioned on the left side in FIG. 1(b), and subsequently the interval lengths become smaller in the sequence such as "a", "d", "b" and "c".

Then, an interval [0. 0.2) corresponding to the character "a" positioned at the beginning of the character string "abc" is segmented based on the above conditions 1) and 2). In the case of a character string "abe", the line segment [0, 0.2) is segmented as in a number line positioned at the center in FIG. 1(b).

Further, an interval [0.04, 0.06) corresponding to the character "b" positioned second from the beginning of the character string "abc" is segmented based on the above conditions 1) and 2). In the case of the character string "abe", the line segment [0.04, 0.06) is segmented as in a number line positioned rightward in FIG. 1(b).

In this way, under the condition shown in FIG. 1(a), an interval [0.05, 0.06) corresponding to the character string "abe" is obtained. Then, as a code corresponding to the character string "abe", when an arbitrary point within the interval ([0.05, 0.06) in the above-mentioned example) defined finally is expressed by a binary number, decimals thereof are outputted in the form of a code.

Note that the binary arithmetic coding method can be dealt with considering it as a special case of the multivalued arithmetic coding method.

As explained above, according to the multivalued arithmetic coding method, the interval is segmented in accordance with the occurrence frequency of the character. However, the multivalued arithmetic coding method is subclassified into three methods, i.e., a static arithmetic coding method, a semi-adaptive type arithmetic coding method and an adaptive type arithmetic coding method, depending on how the interval is segmented.

According to the static arithmetic coding method, the interval is segmented based not on an actual occurrence frequency of the character but on a preset occurrence frequency thereof.

According to the semi-adaptive type arithmetic coding method, the interval is segmented based on an occurrence frequency obtained by scanning the whole character strings first.

According to the adaptive type arithmetic coding method, the interval is segmented based on a character occurrence frequency recalculated each time the character occurs.

It is to be noted that the data compressed by coding is decoded by gradually limiting the interval on the number line in accordance with the code (hereinafter referred to as decompression).

In the decompression, the segmented intervals are obtained at all times as in the case of coding by calculating the same occurrence frequency as that in the coding process.

(Splay Coding Method)

The splay coding method is defined as a coding method using a code tree representing a code table expressed in a tree structure. According to the splay coding method, the character is registered in a terminal node (leaf) of the code tree, and a value allocated to a path extending from an apex (termed a root) of the code tree down to the leaf registered with a symbol is outputted as a code. Further, in the splay coding method, a distance from the root down to the leaf registered with the character is set as a code length.

The code is specifically allocated in the following manner. That is, when tracing from the root down to the leaf, "1" is allocated to a path diverging to the right hand, while "0" is allocated to a path diverging to the left hand. For example, in the case of the code tree shown in FIG. 2(a), a code of a character A is "00", and a code of a symbol E is "1100".

Then, according to the splay coding method, there is executed a process (splay process) to reorganize the code tree so that the code length becomes shorter with a higher occurrence frequency character, more specifically, the code length decreases down to a half. The semi-splaying process is, in other words, a process of allocating a short code to a character having a high occurrence frequency.

The semi-splaying process is implemented by replacing the coded leaf with other leaf or replacing a node on the code tree. One example of the semi-splaying process will be explained with reference to FIG. 2(b).

At first, before executing the semi-splaying process, a distance from the root down to a leaf registered with a character E is "4". Herein, according to the splay process, the leaf registered with the character E is replaced with a leaf registered with a character G, and a node for connecting the leaf after being replaced is exchanged for a node for connecting the characters A, B, C. After performing the splay process in this manner, a distance from the root down to the leaf registered with the character E is "2" and therefore, it can be known, the distance between the root and the leaf gets halved after executing the semi-splaying process.

Note that with respect to the splay coding method, it is preferable to make reference to, e.g., a document "Application of Splay Tree to Data Compression" written by Douglas W. Jones, Commun. of ACM Vol. 131 No. 8 pp. 996–1007.

(Blending Splay Coding Method)

A blending splay coding method is a method of coding by making use of a model known as a blending model.

Explained hereinafter are concepts of a [context], an [order], the [blending model] and the [blending splay coding].

According to the splay coding method, variable-length coding is dynamically affected by an occurrence probability for every character. According to the blending splay coding method, however, for improving a compression ratio, the variable length coding is carried out using a conditional occurrence probability taking in an anterior/posterior relationship between a character string (termed a [context]) which occurs just anterior and a character (coding target character) which occurs just posterior to the context.

To start with, the context (e.g., "ab" shown in FIG. 3(a)) and the coding target character (e.g., "c" shown in FIG. 3(b)) are expressed in a tree structure as illustrated in FIG. 3(b), while the conditional occurrence probability is obtained by counting, each time the character string composed of the characters expressed at respective nodes of a context tree occurs, the number of occurrences thereof at the respective node. Herein, the number of characters contained in the context is referred to an [order].

Referring to FIG. 3(b), levels marked with a 0th order, a first order and a second order indicate that distances from a root position are respectively 0, 1, and 2. Then, all the characters each having an occurrence possibility are shown on the level marked with the 0th order. The characters occurring subsequently to the 0th order characters are shown on the level marked with the first order. The characters occurring subsequently to the first-order characters are shown on the level marked with the second order. For instance, a character "c" pointed by an arrowhead at the second-order level occurs subsequently to a first-order character "b", and the first-order character "b" occurs subsequently to a 0th-order character "a". Hence, it follows that the arrowed second-order character "c" occurs subsequently to a character string "ab".

Further, referring to FIG. 3(b), a symbol P( ) marked under the character of each order represents the conditional occurrence probability taking in the above-explained anterior/posterior relationship between the context and the coding target character. For instance, P(y| X1 X2) represents such a conditional occurrence probability that a character y occurs posterior to a string "X1 X2".

The blending model serves to register (hold) contexts of plural orders and characters subsequent these contexts. A term [blending] of the blending model is derived from the fact that contexts having different orders are mixed. It is to be noted that the blending model is used for not only the blending splay coding but also other kinds of coding.

A method of registering the character in the blending model may, in some cases, adopt a sequential registration type, i.e., a method of increasing the order levelwise in accordance with the context occurred in data. In an initial state, however, all the possible-of-occurring characters are registered beforehand.

For example, the possible-of-occurring characters are three characters "A", "B" and "C", and, if a character string "AABABC" occurs, as in a context tree depicted in FIG. 4(b), there are registered contexts ("AA", "AB", "BA" and "BAB") having an order higher by one level than the order of the already-registered context.

Note that according to the blending model, as illustrated in FIG. 5(a), each node of 0th order and over, which is a parent of nodes with ordinary character, has, on the other hand, a child, which corresponds to "ESC" (also called an escape character) representing an unoccurred character. Numbers marked at respective nodes in FIG. 5(a) are called context tree node numbers and used for distinguishing the respective nodes in a dictionary (a set of data).

Then, a character registering method in contrast with the sequential registration type may be a full registration type method. According to this method, for instance the combination of, all the 0th-order, first-order and second-order (hereinafter simply referred to as 0th/1st/2nd-order) contexts and their children in the coded data are registered. For example, if the possible-of-occurring characters are three characters "A", "B" and "C", and when a string "AABABC" occurs, as depicted in FIG. 4(a), there are registered the combination of each-order context and its children "A", "B", "C" in 0th order, "AA", "AB", "BA", "AB" in the first orders and "AAB", "ABA", "BAB" in the second order. Next, the blending splay coding will be described. The blending splay coding is in principle the same as the splay coding , wherein all the possible-of-occurring characters, i.e., all the character in 0th-order contexts are initial-registered in the code tree (see FIG. 6(c)).

Then, as illustrated in FIGS. 6(a) and 6(b), already-occurred characters and "ESC" (called an escape character or an unoccurred character) representing the characters previously unoccurred are registered in the leaves of the code trees in correspondence to the first- or higher-order contexts in a context tree.

According to the blending splay coding, the code is outputted based on the following criteria:

1) If the occurred character (coding target character) is registered on the code tree, the code allocated to the leaf in a registering position thereof is to be outputted.

2) If the coding target character is not registered on the code tree, unoccurred code is to be outputted.

3). After effecting the processes of 1) and 2), it is assumed that the coding target character occurs posterior to a new context of the order lower by 1 than the previous one, generated by excluding the head character from the previous one, and there are repeated the processes of 1) and 2) till the context comes to the 0th order.

Referring to FIG. 6, when coding a character "d" subsequent to a second-order context "aa", the coding character "d" is registered in the 0th-order context only, and, therefore, ESC (its unoccurred code is 11) giving an indication of being unregistered in the second-order context is at first outputted (see FIG. 6(a)). Then, ESC (its unoccurred code is 11) giving an indication of being unregistered in the first-order context is outputted (see FIG. 6(b)). Finally, the code d [. . . 11] giving an indication of being registered in the 0th-order context is outputted (see FIG. 6(c)). To sum up, a code string (111100 . . . 11) is outputted.

Then, in the splay coding, after coding the coding target character, a coding target character is newly registered both on a code tree and on a context tree of an order higher by one level than the order of the coded character(sequential registration type). This registration is carried out in such a way that the note of ESC in the code tree of an order higher by one level than the order of the coded character is diverged into new ESC and a new leaf, and the coding target character is registered in the newly created leaf, and the coding target character is newly registered on a context tree of an order higher by one level than the order of the coded character.

Based on a statistical coding method, a good compression ratio is obtained by allocating a short code length to a character having a high occurrence probability in accordance with a statistical occurrence frequency of each character. Herein, if the variable-length coding is performed based on not only an occurrence probability (P(y)) per character but also a conditional occurrence probability (e.g., P(y| x1 x2)) in the case of the second-order context) taking in the context, a further compression ratio is obtainable.

On the other hand, according to the adaptive coding method, all combinations of the occurred contexts and the coding target characters are sequentially registered in a code table as well as on the context tree, and the code table of that context is updated to shorten the code length of that character with respect to an already-registered tuple. Herein, the context tree augments with a higher order, and hence, in terms of a restriction of a memory, it is impossible to trace all the conditional occurrence probabilities.

This problem has been pointed out so far, but a specific countermeasure could not be yet presented. For this reason, after registering all the combinations of the contexts occurred at the beginning of the file with the coding target characters up to an upper limit of the memory, no registration is newly effected, but the code length of the already-registered tuple is only updated.

Accordingly, if the registered context does not occur at the beginning of the sentence, a high compression ratio is not obtained. In addition, also when the context itself changes, the high compression ratio is not acquired.

On the other hand, according to a coding/decoding method making use of the blending model, a multiplicity of ESCs are registered in the blending model (see FIG. 5), and, therefore, a large capacity operating area is needed when performing the coding/decoding processes.

SUMMARY OF THE INVENTION

It is a first object of the present invention to provide a data decompressing method capable of obtaining a high compression ratio even with a small-capacity memory and obtaining a high compression ratio even if a remarkable context does not occur at the beginning of a file or if the context itself changes.

Further, it is a second object of the present invention to provide a data compressing method, a data compressing method, a data compressing apparatus and a data compressing apparatus that are capable of attaining a dictionary capacity with a high efficiency without requiring a large capacity operating area even when performing coding/ decoding processes by use of a blending model.

<First Data Compressing Method>

According to the present invention, a first data compressing method is constructed to accomplish the first object.

That is, the first data compressing method involves the use of a data string registering unit for registering a character and a context and a coding information registering unit for registering coding information of character following the context, and the coding information following previous input data. The data compressing method comprises, when the data string inputted previous character strings is set as a context, a data string new registering step, a code information new registering step, a code outputting step and a code information updating step.

(Data String Registering Unit)

A data string registering unit registers a data string. The data may involve the use of alphabets, numerals, hiragana (Japanese phonetic syllabary), katakana (angular Japanese phonetic syllabary) and symbols.

Further, the data string registering unit may make use of, e.g., RAM (Random Access memory), a semiconductor memory device, a magnetic disk storage device, a magnetic tape device, M/O (Magneto-Optic disk device) and an IC card.

Then, the number of occurrences of the data string is preferably registered in the data string registering unit.

Furthermore, the data string registering unit may be constructed in a tree structure and in a table format.

(Code Information Registering Unit)

A code information registering unit registers coding information of the data string constructed to previously include data giving an indication of being unregistered, e.g. an escape code (ESC). The coding information is coded based on the occurrence frequency of the data string.

Further, the code information registering unit may make use of, e.g., the RAM, the semiconductor memory device, the magnetic disk storage device, the magnetic tape device, the M/O and the IC card.

Then, the number of occurrences of the code information is preferably registered in the code information registering unit.

Moreover, the code information registering unit may be constructed in the tree structure and in the table format.

(Data String New Registering Step)

The data string new registering step is to newly register the current character and the context in the data string registering unit.

(Code Information New Registering Step)

The code information new registering step is to newly register the coding information into which the code for the current character following the context in the code information registering unit.

(Code Outputting Step)

The code outputting step is to output the code following the code information registered in the code information registering unit.

(Code Information Updating Step)

The code information updating step is to update the code information registering unit.

<Second Data Compressing Method>

The first data compressing method may be constructed as in a second data compressing method which follows.

That is, according to the second data compressing method, in the first data compressing method, the data string registering unit monitors the frequency of the data string up to a fixed number, and, in the code information new registering step, only the coding information of the current character following the context registered when the frequency exceeds the fixed number is newly registered.

<Third Data Compressing Method>

According to the present invention, a third data compressing method is constructed to accomplish the first object.

More specifically, the third data compressing method involves the use of a data string registering unit for registering a character and the context and a coding information of character following the context and the coding information following previous input data. The third data compressing method comprises, when the data string inputted previous character strings is set as a context, a data string new registering step, a code information new registering step, a code outputting step, a code information updating step and a data string/code information deleting step.

(Data String Registering Unit)

A data string registering unit registers a data string. The data may involve the use of alphabets, numerals, hiragana (Japanese phonetic syllabary), katakana (angular Japanese phonetic syllabary) and symbols.

Further, the data string registering unit may make use of, e.g., the RAM, the semiconductor memory device, the magnetic disk storage device, the magnetic tape device, the M/O and the IC card.

Then, the number of occurrences of the data string is preferably registered in the data string registering unit.

Furthermore, the data string registering unit may be constructed in the tree structure and in the table format.

(Code Information Registering Unit)

A code information registering unit registers coding information of the data string constructed to previously include data giving an indication of being unregistered, e.g. an escape code (ESC). The coding information is coded based on the occurrence frequency of the data string.

Further, the code information registering unit may make use of, e.g., the RAM, the semiconductor memory device, the magnetic disk storage device, the magnetic tape device, the M/O and the IC card.

Then, the number of occurrences of the code information is preferably registered in the code information registering unit.

Moreover, the code information registering unit may be constructed in the tree structure and in the table format.

(Data String New Registering Step)

The data string new registering step is to newly register a current character and the context in said data string registering unit when the current character and the context occurs first time.

(Code Information New Registering Step)

The code information new registering step is to newly register the coding information into which the code for the current character following the context in the code information registering unit when the character and the context occurs second time.

(Code Outputting Step)

The code information outputting step is to output the code following the code information registered in the code information registering unit.

(Code Information Updating Step)

The code information updating step is to update the code information registering unit.

(Data String/Code Information Deleting Step)

The data string/code information deleting step is to delete the data string registered in the data string registering unit and delete the code information registered in the code information registering unit.

<Fourth Data Compressing Method>

The third data compressing method may be constructed as in a fourth data compressing method which follows.

That is, according to the fourth data compressing method, in the third data compressing method, the data string/code information deleting step includes an initialization determining step of determining whether or not the data string registered in the data string registering unit and the coding information registered in the code information registering unit are initialized. The data string/code information deleting step also includes an initializing step of initializing, when determining that the data string and the coding information are initialized in the initialization determining step, the data string registered in the data string registering unit and the coding information registered in the code information registering unit.

<Fifth Data Compressing Method>

The fourth data compressing method may be constructed as in a fifth data compressing method which follows.

That is, according to the fifth data compressing method, in the fourth data compressing method the initializing step is carried out each time a count value exceeds a fixed quantity by counting an accumulation value of a capacity of the new input data in the initialization executing determining step.

<Sixth Data Compressing Method>

The fourth Data compressing method may be constructed as in a sixth data compressing method which follows.

That is, according to the sixth data compressing method, in the fourth data compressing method, a data compression ratio is monitored, and, when this data compression ratio be worse, the initializing step is carried out in the initialization executing determining step.

<Seventh Data Compressing Method>

The fourth data compressing method may be as in a seventh data compressing method which follows.

That is, according to the seventh data compressing method, in the fourth data compressing method, the initializing step is carried out when a total number of registrations in the data string registering unit exceeds a fixed number on the occasion of a new registration in the initialization executing determining step.

<Eighth Data Compressing Method>

The third data compressing method may be constructed as in an eighth data compressing method which follows.

Namely, according to the eighth data compressing method, in the third data compressing method, the data string/code information deleting step includes a deletion determining step of determining whether or not the data string registered in the data string registering unit and the coding information registered in the code information registering unit are deleted. The data string/code information deleting step also includes a deleting target selecting step of selecting, when determining that the deletion thereof is carried out in the deletion executing determining step, the data string to be deleted and the coding information to be deleted. The data string/code information deleting step further includes a deleting step of deleting the data string and the coding information that are selected in the deleting target selecting step respectively from the data string registering unit and the code information registering unit.

<Ninth Data Compressing Method>

The eighth data compressing method may be constructed as in a ninth data compressing method which follows.

That is, according to the ninth data compressing method, in the eighth data compressing method, in the deleting target selecting step, if the data string registering unit is viewed as a tree structure, all pointers pointing nodes defined as internal nodes of the tree and leaves as terminals of the tree are registered in a deleting rank list, and the data string and the coding information that are pointed by the pointers registered in a low rank in this deleting rank lists are deleted in the deleting step.

<Tenth Data Compressing Method>

The eighth data compressing method may be constructed as in a tenth data compressing method which follows.

That is, according to the tenth data compressing method, in the eighth data compressing method, in the deleting target selecting step, if the data string registering unit is viewed as a tree structure, pointers pointing leaves as terminals of the tree are registered in one deleting rank list, and the data string and the coding information that are pointed by the pointers registered in a low rank in the deleting rank list are deleted in the deleting step.

<Eleventh Data Compressing Method>

The eighth data compressing method may be constructed as in an eleventh data compressing method which follows.

That is, according the eleventh data compressing method, in the eighth data compressing method, in the deleting target selecting step, if the data string registering unit is views as a tree structure, pointers pointing internal nodes of the tree are registered in one deleting rank list, and the data string and the coding information that are pointers registered in a low rank in the deleted in the deleting step.

<Twelfth Data Compressing Method>

The twelfth data compressing method may be constructed as in an eleventh data compressing method which follows.

That is, according the twelfth data compressing method, in the ninth-eleventh data compressing method, in the deleting target selecting step, the frequency of the pointer is monitored, and the pointer having a high frequency is registered in a high rank in the deleting rank list.

<Thirteenth Data Compressing Method>

The eighth data compressing method may be constructed as in a thirteenth data compressing method which follows.

That is, according to the thirteenth data compressing method, in the eighth data compressing method, in the deleting target selecting step, the pointer corresponding to a newly registered leaf is registered in the highest rank in the deleting rank list, and the pointer corresponding to the context which has occurred, the character and the context should be moved to the most significant of the deleting rank list.

<Fourteenth Data Compressing Method>

The eighth data compressing method may be constructed as in a fourteenth data compressing method which follows.

That is, according to the fourteenth data compressing method, in the eighth data compressing method, in the deleting target selecting step, the pointer corresponding to a newly registered leaf is registered in the lowest rank in the deleting rank list, and the order in the deleting rank list of the pointer corresponding to the context which has occurred, the character and the context should be halved.

<Fifteenth Data Compressing Method>

The eighth data compressing method may be constructed as in a fifteenth data compressing method which follows.

That is, according to the fifteenth data compressing method, in the eighth data compressing method, in the deleting target selecting step, the order in the deleting rank list of the pointer corresponding to the context which has occurred, the character and the context should be raised by one.

<Sixteenth Data Compressing Method>

The eighth data compressing method may be constructed as in a sixteenth data compressing method which follows.

That is, according to the sixteenth data compressing method, in the eighth data compressing method, in the deleting target selecting step, when the frequency of a character and a context is less than the predetermined value, the set of the character and the context should be selected as a deleting data.

<Seventeenth Data Compressing Method>

The eighth data compressing method may be constructed as in a seventeenth data compressing method which follows.

That is, according to the seventeenth data compressing method, in the eighth data compressing method, in the deleting target selecting step, when the frequency of a character and a context is less than the fixed value, the set of the character and the context should be selected as a deleting data.

<Eighteenth Data Compressing Method>

The eighth data compressing method may be constructed as in an eighteenth data compressing method which follows.

That is, according to the eighteenth data compressing method, in the eighth data compressing method, in the deleting execution determining step, the number of registrations in the data string registering unit is monitored; when this number exceeds a fixed number on the occasion of a new registration, one of the deleting targets selected in the deleting target selecting step is deleted in the deleting step; and a new registration tuple is instead registered.

<Nineteenth Data Compressing Method>

The eighth data compressing method may be constructed as in a nineteenth data compressing method which follows.

That is, according to the nineteenth data compressing method, in the eighth data compressing method, in the deleting step, a half of the data strings registered in the data string registering unit are deleted.

<Twentieth Data Compressing Method>

The third data compressing method may be constructed as in a twentieth data compressing method which follows.

That is, according to the twentieth data compressing method, in the third data compressing method, the data string/code information deleting step includes a deleting target selecting step of selecting the data string to be deleted and the coding information to be deleted; when the number of registrations in the data string registering unit exceeds a fixed number on the occasion of a new registration, one of the deleting targets selected in the deleting target selecting step is deleted as well as registering a new registration tuple; and, when a data compression ratio be worse, initialize the data string registered in the data string registering unit and the code information in the code information registering unit.

<Twenty-first Data Compressing Method>

The third data compressing method may be constructed as in a twenty-first data compressing method which follows.

That is, according to the twenty-first data compressing method, in the third data compressing method, if the code information registering unit is constructed of a code tree having a binary tree structure, leaves of the code tree are set as data while paths extending from the root of the code tree down to the respective leaves are set as codes.

Then, in the code information updating step, the code tree is updated by exchanging a node's child, wherein the node is the path of root and current data's leaf.

Then, in the code information new registering step, the code information is registered in the new leaf obtained by diverging the leaf of the code tree.

Subsequently, in the data string/code information deleting step, the leaf of the code tree is deleted together with the diverging node positioned closer by one path to the root.

<Twenty-second Data Compressing Method>

The first data compressing method may be constructed as in a twenty-second data compressing method which follows.

That is, according to the twenty-second data compressing method, in the first-third data compressing method, the code information registered in the code information registering unit is coded by an arithmetic coding method.

<Twenty-third Data Compressing Method>

The twenty-second data compressing method may be constructed as in a twenty-third compressing method which follows.

That is, according to the twenty-third data compressing method, in the twenty-second data compressing method, the data string/code information deleting step includes, a deletion determining step, a deleting target selecting step, a deleting step and a updating-for-deletion step.

The deletion determining step is to determine whether or not the data string registered in the data string registering unit and the coding information registered in the code information registering unit are deleted.

The deleting target selecting step is to select, when determining that the deletion thereof is carried out in the deletion executing determining step, the data string to be deleted and the coding information to be deleted.

The deleting step is to delete the data string and the coding information that are selected in the deleting target selecting step respectively from the data string registering unit and the code information registering unit.

The updating-for-deletion step is to update the code information registering unit after being deleted in the deleting step.

Then, in the updating-for-deletion step, the number occurrences of the code information is divided by a multiple of 2, and, when a divided value is 1 or smaller, the number of occurrence is set to 1.

<Twenty-fourth Data Compressing Method>

The twenty-fourth data compressing method according to the present invention may be constructed as bellow to accomplish the second object described above.

That is, the twenty-fourth data compressing method of executing a compression by coding, with a limited kind of characters serving as a target, an input character in accordance with a context representing an already-occurred character string comprises a context dictionary registering step, a code table registering step, an order setting step, a registration determining step, an unoccurred code registering step, an unregistered processing step, a repeating step, a code outputting step and an additional registering step. Then, an unoccurred code corresponds to a context of a set order.

(Context Dictionary Registering Step)

The context dictionary registering step is to register a combination of a coding process target context with a coding target character conceived as a child thereof in a context dictionary.

(Code Table Registering Step)

The code table registering step is to register, in a code table, information when coding the coding target character registered in the context dictionary.

(Order Setting Step)

The order setting step is to set an order expressed by the number of characters contained in the context.

(Registration Determining Step)

The registration determining step is to determine whether or not the combination of the coding target character and the coding process target context having the set order is registered in the context dictionary.

(Unoccurred Code Registering Step)

The unoccurred code registering step is to register, if there is no combination of the coding target character and the coding process target context, an unoccurred code indicating an escape into a context having a lower order in a code table corresponding to the context of the set order.

(Unregistered Processing Step)

The unregistered processing step is to output, if the combination of the coding target character and the coding process target context is found to be unregistered in the registration determining step, the unoccurred code of the set order and also decreasing the set order by one level.

(Repeating Step)

The repeating step is to repeat the registration determining step, an additional registering step and the unregistered processing step till the combination of the coding target character and the coding process target context is found to be registered in the registration determining step.

(Code Outputting Step)

The code outputting step is to output, if the combination of the coding target character and the coding process target context is found to be registered in the registration determining step, a code corresponding to the coding target character from the code table.

(Additional Registering Step)

The additional registering step is to additionally register the coding target character both in the code table and in the context dictionary having an order higher than the order of the coded character.

<Twenty-fifth Data Compressing Method>

The twenty-fourth data compressing method may be constructed as in a twenty-fifth data compressing method which follows.

That is, according to the twenty-fifth data compressing method, in the twenty-fourth data compressing method, the unoccurred code in the code table has a relationship corresponding to a storage location in the code table.

Then, when coding the unoccurred character, the code corresponding to the storage location in the code table is outputted.

<Twenty-sixth Data Compressing Method>

The twenty-fourth data compressing method may be constructed as in a twenty-sixth data compressing method which follows.

That is, according to the twenty-sixth data compressing method, in the twenty-fourth data compressing method, with respect to each combination of the coding target character and the coding process target context, there are registered a code table's storage location corresponding to the coding process target context and a code table's storage location corresponding to a second coding process target context generated by connecting the coding target character to the coding process target context, Then, when outputting the unoccurred code relative to the second coding process target context, the code table's storage location corresponding to the second coding process target context is employed.

<Twenty-seventh Data Compressing Method>

The twenty-fourth data compressing method may be constructed as in a twenty-seventh data compressing method which follows.

That is, according to the twenty-seventh data compressing method, in the twenty-fourth data compressing method, the context dictionary is constructed in the form of a context tree. Then, the code table is constructed in the form of a binary code tree.

<Twenty-eighth Data Compressing Method>

The twenty-seventh data compressing method may be constructed as in a twenty-eighth data compressing method which follows.

That is, according to the thirtieth data compressing method, in the twenty-ninth data compressing method, the last branch among respective branches corresponding to the non-occurred codes in the code tree is connected to the root of the code tree, and, when coding the unoccurred character, the code corresponding to a divergence of each node is outputted through one cycle tracing a parent thereof from the root of the code tree back again to the root.

<Twenty-ninth Data Compressing Method>

The twenty-seventh data compressing method may be constructed as in a twenty-ninth data compressing method which follows.

That is, according to the twenty-ninth data compressing method, in the twenty-seventh data compressing method, with respect to each combination of the coding target character and the coding process target context, there are registered a code tree root corresponding to the coding process target context and a code tree root corresponding to the second coding process target context generated by connecting the coding target character to the coding process target context.

Then, when outputting the unoccurred code relative to the second coding process target context, the code tree root corresponding to the second coding process target context is employed.

<First Data Decompressing Method>

A first data decompressing method is, for accomplishing the above second object, constructed as below.

That is, the first data decompressing method of decompressing, with a limited kind of characters serving as a target, compressed data by coding an input character in accordance with a context representing an already-occurred character string comprises an order setting step, a context dictionary register, a code table registering step, code table determining step, an unoccurred code registering step, a decompression processing step, a character outputting step, and a decompressed character additional registering step. Then, the unoccurred code in the decoding process target context of the set order is made corresponding to the context of the set order.

(Order Setting Step)

The order setting step is to set an order expressed the number of characters contained in the context.

(Context Dictionary Registering Step)

The context dictionary registering step is to register, in a context dictionary, a combination of a decoded character and a context having a predetermined order.

15

(Code Table Registering Step)

The code table registering step is to register information for decoding in the code table independently for every decoded context.

(Code Table Determining Step)

The code table determining step is to determine a code table corresponding to a decoding process target context of a predetermined order composed of the characters decoded just anterior thereto.

(Unoccurred Code Registering Step)

The unoccurred code registering step is to register, if the decoding target character is not registered in the decoding process target context of the set order, an unoccurred code indicating an escape into a context of a lower order 1 in the code table corresponding to the context of the set order.

(Decompression Processing Step)

The decompression processing step is to decompress the unoccurred code of each order and to decrease the set order by one level till the character is decompressed.

(Character Outputting Step)

The character outputting step is to output, when the character is decompressed, a character corresponding to the code from the code table.

(Decompressed Character Additional Registering Step)

The decompressed character additional registering step is to additionally register, when the character can be decompressed at a certain order, the decompressed character both in the code table and in the context dictionary of an order higher than the order of the decompressed character.

<Second Data Decompressing Method>

The first data decompressing method may be constructed as in a second data decompressing method which follows.

That is, according to the second data decompressing method, in the first data decompressing method, an unoccurred code in the code table has a relationship corresponding to a storage location in the code table.

Then, the code corresponding to the storage location in the code table is decompressed as an unoccurred character.

<Third Data Decompressing Method>

The first data decompressing method may be constructed as in a third data decompressing method which follows.

That is, according to the third data decompressing method, in the first data decompressing method, in the context dictionary registering step, with respect to each combination of the decoding target character and the decoding process target context, there are registered a code table's storage location corresponding to the decoding process target context and a storage location for the second decoding process target context generated by connecting the decoding target character to the decoding process target context.

Then, when decoding the second decoding process target context, the storage location for the second decoding process target context is employed.

<Fourth Data Decompressing Method>

The first data decompressing method may be constructed as in a fourth data decompressing method which follows.

16

That is, according to the fourth data decompressing method, in the first data decompressing method, the context dictionary is constructed in the form of a context tree.

Then, the code table is constructed in the form of a binary code tree.

<Fifth Data Decompressing Method>

The fourth data decompressing method may be constructed as in a fifth data decompressing method which follows.

That is, according to the fifth data decompressing method, in the fourth data decompressing method, a last branch among respective branches corresponding to the unoccurred codes in the code tree is connected to the root of the code tree, and, when decoding the unoccurred code, the code is identified as the unoccurred code through one cycle tracing right and left children in accordance with a code bit from the root of the code tree back again to the root.

<Sixth Data Decompressing Method>

The fourth data decompressing method may be constructed as in a sixth data decompressing method which follows.

That is, according to the sixth data decompressing method, in the fourth data compressing method, with respect to each combination of the decoding target character and the decoding process target context, there are registered a code tree root corresponding to the decoding process target context and a code tree root corresponding to the second decoding process target context generated by connecting the decoding target character to the decoding process target context.

Then, when decompressing the second decoding process target context, the code tree root corresponding to the second decoding process target context is employed.

<First Data Compressing Apparatus>

A first data compressing apparatus is, for accomplishing the above second object, constructed as below.

That is, the first data compressing apparatus for executing a compression by coding, with a limited kind of characters serving as a target, an input character in accordance with a context representing an already-occurred character string comprises a context dictionary registering unit, a code tree registering unit, an order setting unit, a registration determining unit, an unoccurred code registering unit, an unregistered processing unit, a repeating unit, a code outputting unit and a coding target character additional registering unit.

(Context Dictionary Registering Unit)

The context dictionary registering unit registers a combination of a coding process target context and a coding target character conceived as a child thereof in a context dictionary.

Further, the context dictionary registering unit allocates a univocal identifier to the context to be registered.

(Code Tree Registering Unit)

The code tree registering unit registers in a binary code tree, information when coding the coding target character registered in the context dictionary.

Further, the code tree registering unit allocates a univocal identifier to the root of the code tree.

(Order Setting Unit)

The order setting unit sets an order expressed by the number of characters contained in the context.

(Registration Determining Unit)

The registration determining unit determines whether or not the combination of the coding target character and the coding process target context having the set order is registered in the context dictionary.

(Unoccurred Code Registering Unit)

The unoccurred code registering unit registers, if there is no combination of the coding target character and the coding process target context, an unoccurred code indicating an escape into a context having a lower order as a root of the code tree corresponding to the context of the set order.

Further, the unoccurred code registering unit allocates, to the unoccurred code, an identifier coincident with the identifier allocated in the context dictionary registering unit and with the identifier allocated in the code tree registering unit.

(Unregistered Processing Unit)

The unregistered processing unit outputs, if the combination of the coding target character and the coding process target context is found to be unregistered in the registration determining unit, the unoccurred code of the set order and also decreases the set order by one level.

(Repeating Unit)

The repeating unit repeats the processes conducted in the registration determining unit, an additional registering unit and the unregistered processing unit till the combination of the coding target character and the coding process target context is found to be registered in the registration determining unit.

(Code Outputting Unit)

The code outputting unit outputs, if the combination of the coding target character and the coding process target context is found to be registered in the registration determining unit, codes corresponding to divergences of nodes from a root of the code tree down the leaf stored with the coding target character.

(Coding Target Character Additional Registering Unit)

The coding target character additional registering unit additionally registers the coding target character both in the code tree and in the context dictionary having an order higher than the order at which the combination being registered is found.

<Second Data Compressing Apparatus>

The first data compressing apparatus may be constructed as in a second data compressing apparatus which follows.

That is, according to the second data compressing apparatus, in the first data compressing apparatus, the code outputting unit determines whether the coding target character is an unoccurred character or an ordinary character and, when the initialization determining unit determines that the character is the unoccurred character, searches a node of the code tree through one cycle tracing a parent thereof from the root of the code tree back again to the root.

(Third Data Compressing Apparatus>

The first data compressing apparatus may be constructed as in a third data compressing apparatus which follows.

That is, according to the third data compressing apparatus, in the first data compressing apparatus, the context dictionary registering unit registers, with respect to each combination of the coding target character and the coding process target context, a code tree root corresponding to the coding process target context and a code tree root corresponding to the second coding process target context generated by connecting the coding target character to the coding process target context.

Then, when the code outputting unit outputs the unoccurred code relative to the second coding process target context, the code tree root corresponding to the second coding process target context is employed.

<First Data Decompressing Apparatus>

The first data decompressing apparatus is, for accomplishing the above second object, constructed as below.

That is, the first data decompressing apparatus for decompressing, with a limited kind of characters serving as a target, compressed data by coding an input character in accordance with a context representing an already-occurred character string, comprises an order setting unit, a context dictionary registering unit, a code tree determining unit, an unoccurred code registering unit, a context changing unit, a decoding unit and a decompressed code registering unit.

(Order Setting Unit)

The order setting unit sets an order expressing the number of characters contained in the context.

(Context Dictionary Registering Unit)

The context dictionary registering unit registers, in a context dictionary, a combination of a decoded character with a context having a predetermined order.

Further, the context dictionary registering unit allocates a univocal identifier to the context to be registered.

(Code Tree Registering Unit)

The code tree registering unit registers information for decoding in a binary code tree independently for every decoded context.

Further, the code tree registering unit allocates a univocal identifier to the root of the code tree.

(Code Tree Determining Unit)

The code tree determining unit determines a code tree corresponding to a decoding process target context of the predetermined order composed of the characters decoded just anterior thereto.

(Unoccurred Code Registering unit)

The unoccurred code registering unit registers, if the decoding target character is not registered in the decoding process target context of the set order, an unoccurred code indicating an escape into a context of a lower order as a root of the code tree corresponding to the context of the set order.

Then, the unoccurred code registering unit allocates, to the unoccurred code, an identifier coincident with the identifier allocated in the context dictionary registering unit and with the identifier allocated in the code tree registering unit.

(Context Changing Unit)

The context changing unit repeats, after decompressing the unoccurred code of each order, the decompressing process by decreasing the order of the decoding process target context till the character is decompressed.

(Decoding Unit)

The decoding unit outputs the character after tracing branches of nodes in accordance with respective bits of the codes from the root of the code tree down to a leaf registered with the decoding target character.

(Decompressed Character Registering Unit)

The decompressed character registering unit registers the decompressed character both in the code tree and in the context of an order higher than the order of the decompressed character.

<Second Data Decompressing Apparatus>

The first data decompressing apparatus may be constructed as in the second data decompressing apparatus which follows.

That is, according to the second data decompressing apparatus, in the first data decompressing apparatus, the decoding unit, when decoding the unoccurred code, identifies the code as the unoccurred code by confirming one cycle tracing right and left children in accordance with a code bit from the root of the code tree back again to the root.

<Third Data Decompressing Apparatus>

The first data decompressing apparatus may be constructed as in a third data decompressing apparatus which follows.

That is, according to the third data decompressing apparatus, in the first data decompressing apparatus, the context dictionary registering unit registers, with respect to each combination of the decoding target character and the decoding process target context, a code tree root corresponding to the decoding process target context and a code tree root corresponding to the second decoding process target context generated by connecting the decoding target character to the decoding process target context.

Then, the code outputting unit employs, when decoding relative to the second decoding process target context, the code tree root corresponding to the second decoding process target context.

According to the first data compressing method, the registration in the code information registering unit is restricted. Therefore, the memory required for the code information registering unit can be effectively utilized because of the registration in the code information registering unit being restricted, and a high compression ratio can be obtained with a small-capacity memory.

According to the second through twenty-third data compressing methods, the data string registered in the data string registering unit and the coding information registered in the code information registering unit are, respectively, wholly or partly deleted. For this reason, the high data compression ratio can be obtained even when a remarkable context does not occur at the beginning of the sentence or when the context itself changes.

According to the twenty-fourth through twenty-nine data compressing methods and the first through third data compressing apparatuses, the unoccurred character (ESC) does snot have the number of its own, and, hence, a large-capacity operating area is not required even when coded by use of a blending model, whereby a high efficiency dictionary capacity is attainable.

According to the first through sixth data decompressing methods and the first through third data decompressing apparatuses, the unoccurred character (ESC) does not have the number of its own, and, therefore, the large-capacity operating area is not needed even when decoded by use of the blending model, whereby the high efficiency dictionary capacity can be attained.

BRIEF DESCRIPTION OF THE DRAWINGS

Other objects and advantages of the present invention will become apparent during the following discussion in conjunction with the accompanying drawings, in which:

FIG. 1 is a diagram showing the principle of multivalued arithmetic coding; FIG. 1(a) shows a table for storing a corresponding relationship between characters; FIG. 1(b) shows an example of performing an interval segmentation with respect to a character string "abc" by making use of the table in FIG. 1(a);

FIG. 2 is a diagram illustrating the principle of splay coding.

FIG. 3 is a diagram illustrating an example of registration in a context tree.

FIG. 4 is a diagram showing an example of a registration of the context.

FIG. 5 is a diagram showing an example of a context tree and a code tree that are used for the splay coding.

FIG. 6 is a diagram showing an example of the code tree used for the splay coding.

FIG. 13 is a flowchart showing processes of the data compressing method of the statistical coding by updating a deletion rank list.

FIG. 14 is a diagram showing a deleting rank list when coded with cl aa in the third embodiment.

FIG. 16 is a diagram illustrating a concept of a context tree deleting method carried out in a fifth embodiment;

FIG. 17 is a diagram showing a relationship between a file size, the number of dictionary registrations and a coding rate according to a conventional method wherein all the registrations are not deleted in the first through fifth embodiments.

FIG. 18 is a diagram showing a relationship between the file size, the number of dictionary registrations and the coding rate according to a method wherein the registrations are restricted but not deleted in the first through fifth embodiments.

FIG. 19 is a diagram showing a relationship between the file size, the number of dictionary registrations and the coding rate according to a method wherein both the full registrations and the initialization are conducted in the first through fifth embodiments.

FIG. 20 is a diagram showing a relationship between the file size, the number of dictionary registrations and the coding rate according to a method wherein both the full registrations and the partial deletion are performed in the first through fifth embodiments.

FIG. 21 is a diagram showing an example of the context tree and an example of contents registered therein in a sixth embodiment.

FIG. 23 is a diagram showing examples of a new character registration by the conventional method and in the sixth embodiment.

DETAILED DESCRIPTION OF THE PREFERRED EMBODIMENTS

Embodiments of the present invention will hereinafter be discussed with reference to the accompanying drawings.

(First Embodiment)

Figure 7:
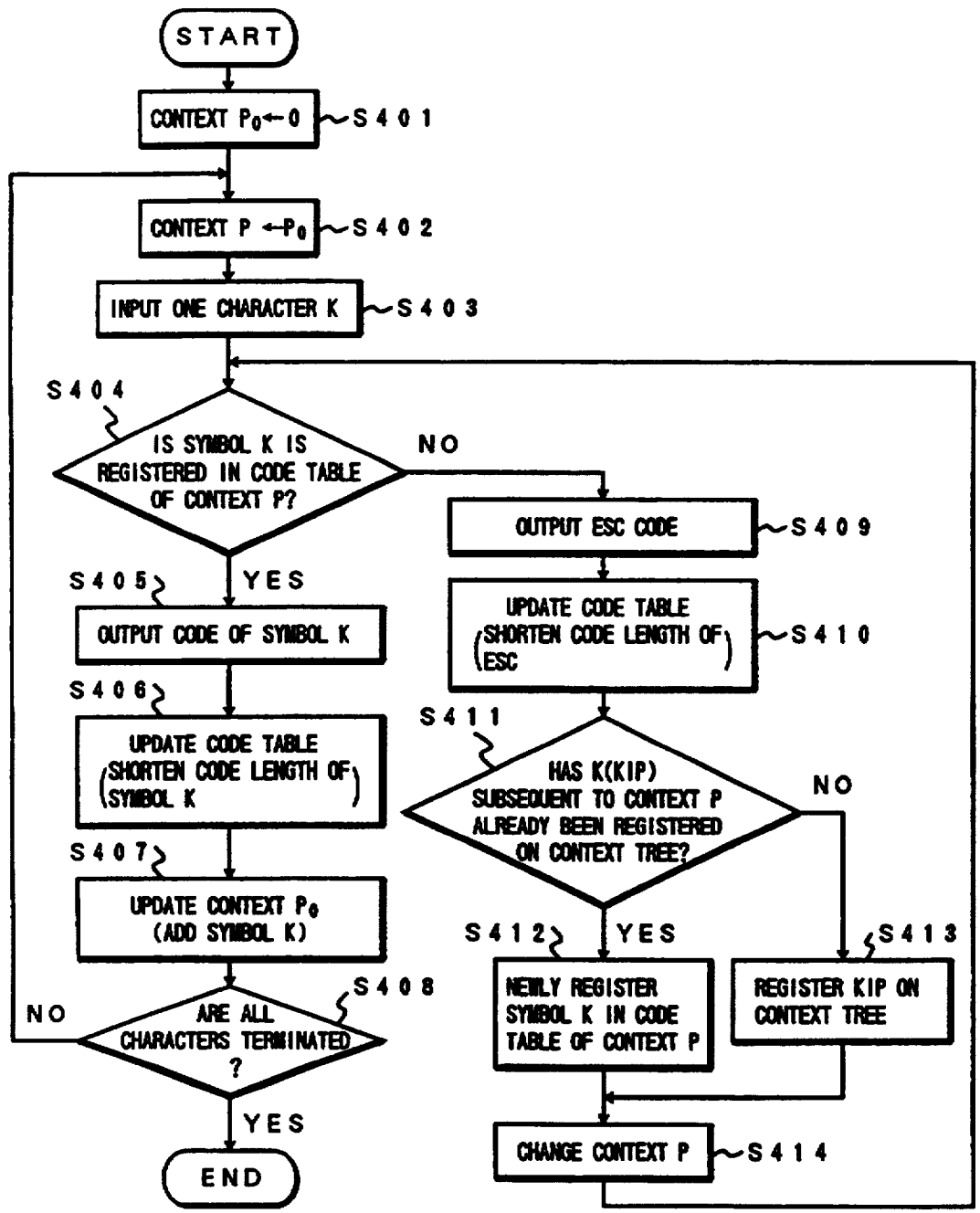
FIG. 7 is a flowchart (part 1) showing processes of a data compressing method of performing the statistical coding by executing a registration restricting process in a first embodiment.

A first embodiment is concerned with a data compressing method of performing a probability statistic adaptive type coding by executing a registration restricting process. FIG. 7 is a flowchart (part 1) showing processes of a data compressing method carried out in a first embodiment. In the following discussion, the symbol $P_0$ represents a character (context) that is inputted and coded just anterior, and, it is assumed that just-anterior n-characters are to be stored when encoded in, e.g., an n-th order context model.

At first, "0" is set to initialize the context $P_0$ (step S401). Note that the setting of 0 implies replacing all the elements of the context $P_0$ with "0" (the same as below).

Next, the context $P_0$ is copied into a variable P representing the context (step S402). When a symbol K is inputted (step S403), whether or not the symbol K is registered in a code table of the context P is checked (step S404).

In step S404, if determined to be [registered], there is outputted a code corresponding to the symbol K by use of the code table of the context P (step S405).

After outputting the code, the code table is updated to shorten the code of the symbol K which has been previously code-outputted (step S406).

Then, the context $P_0$ is updated by adding the symbol K (step S407).

Subsequently, whether or not all the characters are terminated is checked (step S408).

If determined to be [unterminated] in step S408, the processing comes to an end.

Whereas if determined to be [unregistered] in step S404, an escape code (ESC) representing a non-occurred symbol is outputted (step S409).

After outputting the code, the code table is updated to shorten a code length of the ESC code which has previously been code-outputted (step S410).

Checked ensuingly is whether or not K (K| P) subsequent to the context P has already been registered (step S411).

In step S411, if determined to be [registered], the symbol K is newly registered in the code table of the context P (step S412).

In step S411, if determined to be [unregistered], K| P is newly registered in a context tree (step S413).

The context P is updated after executing the processes in steps S412 and S413, and the processing goes back to step S404.

The processes described above are repeated with respect to all the inputted characters.

Figure 8:
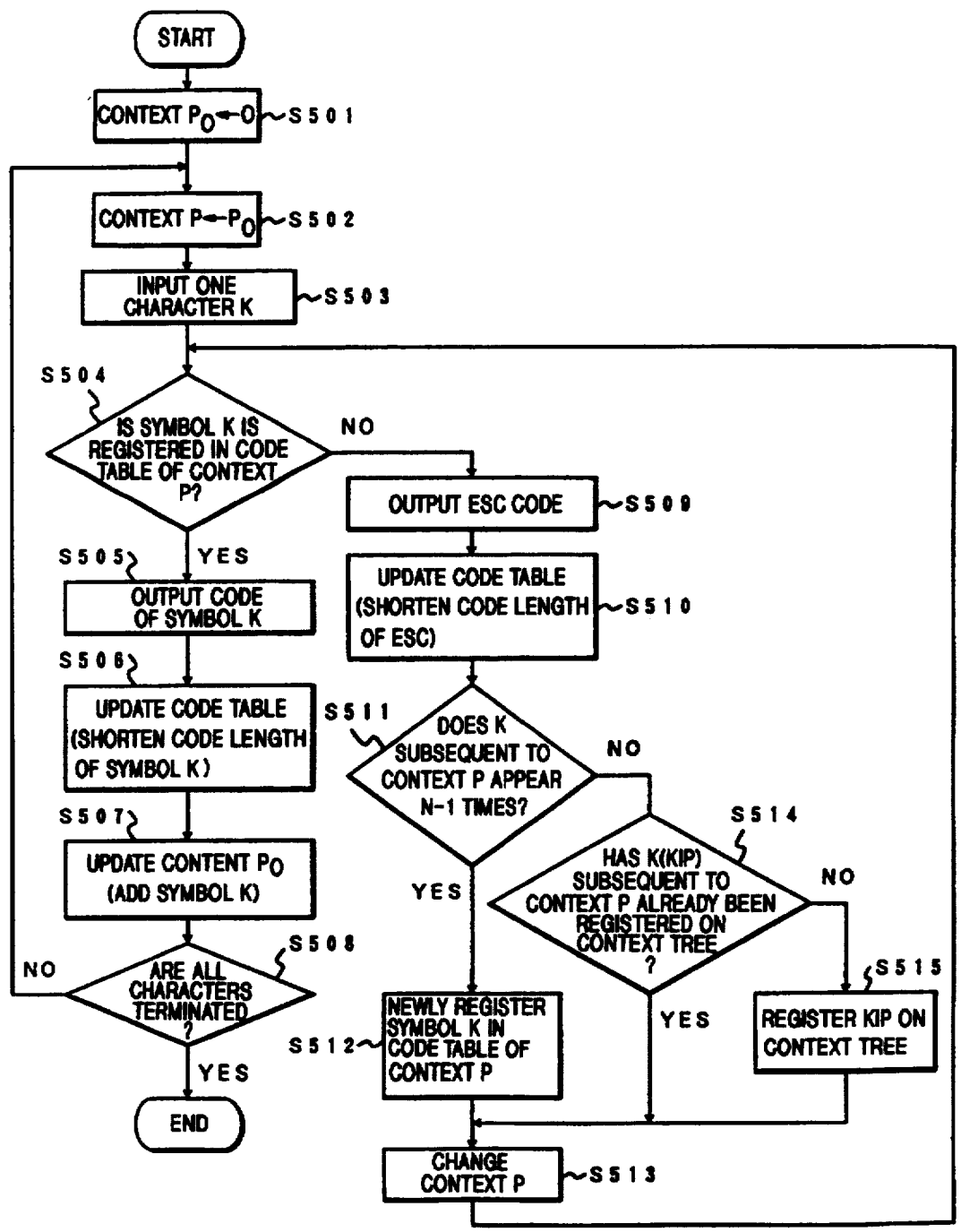
FIG. 8 is a flowchart (part 2) showing processes of the data compressing method of performing the statistical coding by executing the registration restricting process in the first embodiment.

Next, FIG. 8 is a flowchart (part 2) showing processes of the data compressing method carried out in the first embodiment. Steps S501–S508 in FIG. 8 are the same as steps S401–S408 in FIG. 7, and, hence, the explanation thereof will be omitted.

In step S504, if determined to be [unregistered], the ESC code is outputted by use of the code table of the context P (step S509).

After outputting the code, the code table of the context P is updated to shorten the code length of the ESC code which has been previously been code-outputted (step S510).

Then, whether or not the symbol K subsequent to the context P has already occurred (N−1) times is checked (step S511).

In step S511, if determined to be [occurred], the symbol K is newly registered in the code table of the context P (step S512).

If determined as to be [non-occurred] in step S511, there is checked whether or not K (K| P) subsequent to the context P has already been registered (step S514).

In step S514, if determined to be [already registered], the processing proceeds to step S513.

In step S514, whereas if determined to be [unregistered], K| P is newly registered in the context tree (step S515).

The context P is updated after executing the processes in steps S512 and S515, and the processing returns to step S504.

The processes described above are repeated with respect to all the inputted characters.

(Second Embodiment)

A second embodiment is concerned with the data compressing method of performing the probability statistic adaptive type coding by executing a deleting process.

According to the deleting process, in processes relative to the outputting of the code and the updating of the code table, as in the same way with the registration restricting process, if K| P is not registered in the context tree, it is registered both in the context tree and in the code tree. Further, when implementing a new deletion, the code table and the context are initialized.

Figure 9:
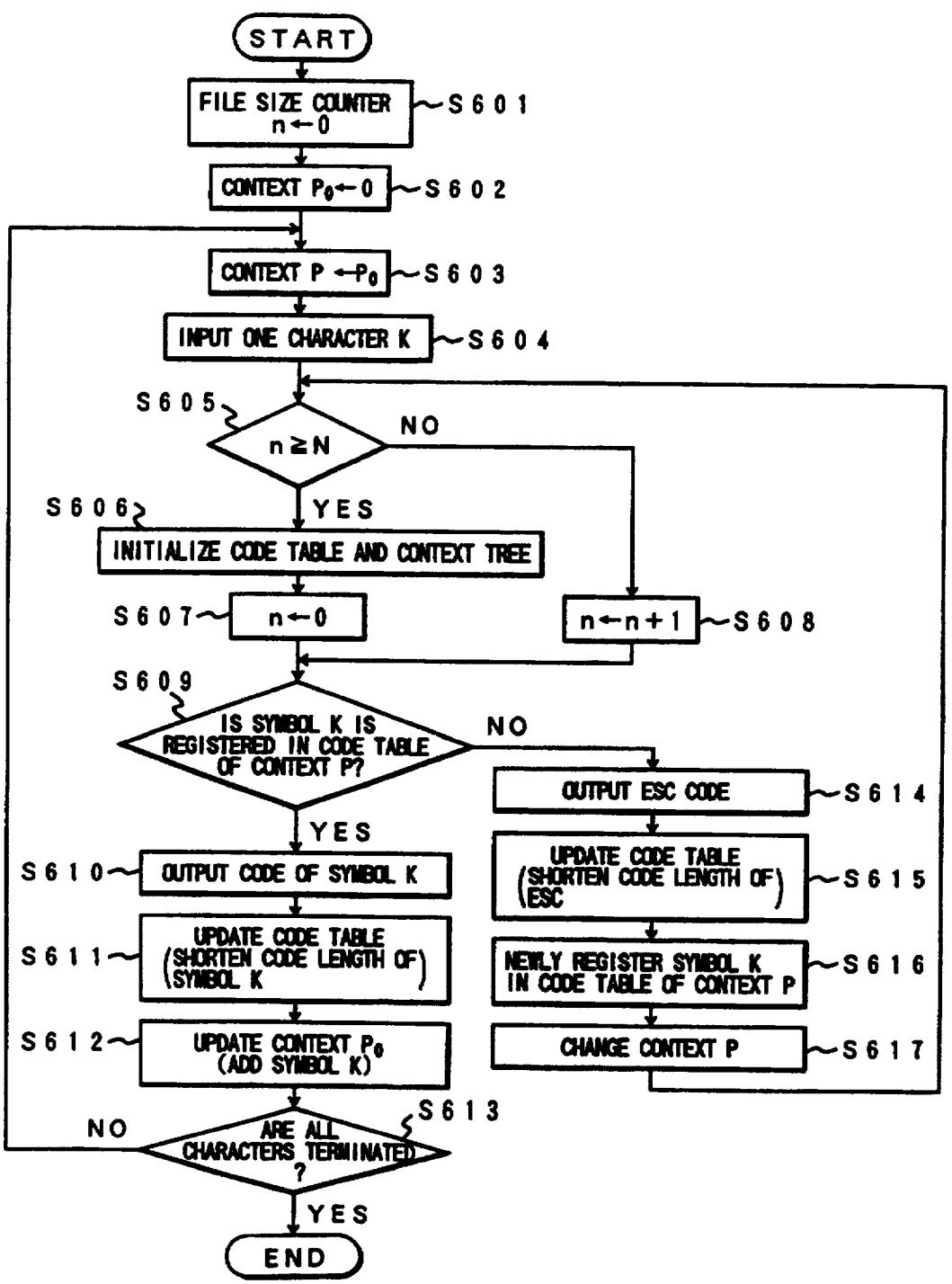
FIG. 9 is a flowchart showing processes of the data compressing method of performing the statistical coding by executing an initialization for every fixed file size in a second embodiment.

FIG. 9 is a flowchart showing processes of the data compressing method of performing the probability statistic adaptive type coding by executing the deleting process with a such a content that the initialization is effected when reaching a fixed count value in the case of counting a size of the input data.

To start with, a value of (n) corresponding to a file size counter is set to "0" (step S601).

Next, "0" is set in the context $P_0$ (step S602).

Subsequently, the context $P_0$ is inputted to the variable P (context) (step S603). When the symbol K is inputted (step S604), whether n≧N or not is checked (step S605).

If determined to be [YES] in step S605, the code table and the context tree are initialized (step S606).

Then, the value of (n) is set to "0" (step S607).

In step S605, whereas if determined to be [NO], the value of (n) is incremented by 1 (step S608).

After performing the processes in steps S607 and S608, whether or not the symbol K is registered in the code table of the context P is checked (step S609).

In step S609, if determined to be [registered], the code of the symbol K is outputted by employing the code table of the context P (step S610).

Then, the code table is updated to shorten the code of the symbol K that has been previously code-outputted (step S611).

Then, the context $P_0$ is updated by adding the symbol K (step S612).

Subsequently, whether or not all the characters are terminated is checked (step S613).

If determined to be [unterminated] in step S613, the processing returns to step S603.

Whereas if determined to be [terminated] in step S613, the processing is ended.

Whereas if determined to be [unregistered] in step S609, the escape ESC code is outputted (step S614).

After outputting the code, the code table is updated to shorten the code length of the ESC code which has previously been code-outputted (step S615).

Then, the symbol K is newly registered in the code table of the context P (step S616).

Subsequently, the context P is changed (step S617), and the processing goes back to step S605.

The processes described above are repeated with respect to all the inputted characters.

Figure 10:
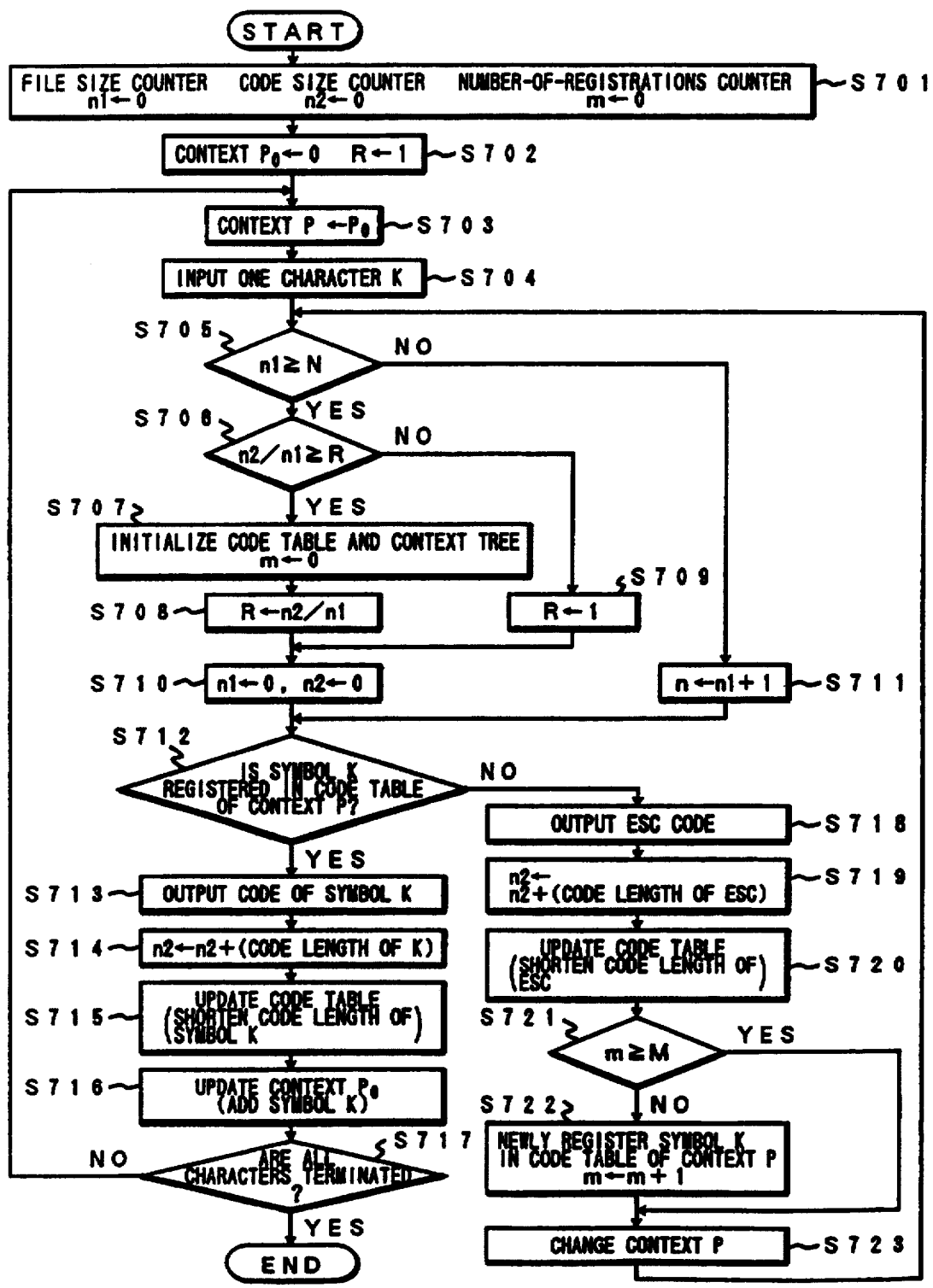
FIG. 10 is a flowchart showing processes of the data compressing method of performing the statistical coding by executing the initialization when a compression ratio be worse in the second embodiment.

Next, FIG. 10 is a flowchart showing processes of the data compressing method of performing the probability statistic adaptive type coding by executing the deleting process with a such a content that the initialization is effected when a compression ratio is compared per fixed file size and decreased.

To begin with, respectively, a value of n1 corresponding to the file size counter is set to "0"; a value of n2 corresponding to code size counter is set to "0"; and a value of (m) corresponding to a number-of-registrations counter is set to "0" (step S701).

Next, the context $P_0$ is set to "0", and a value of a variable R is set to "1", respectively (step S702).

Next, the context $P_0$ is inputted to a variable P (context) (step S703). When the symbol K is inputted (step S704), whether a relationship of n1≧N is established or not is checked (step S705).

In step S705, if determined to be [YES], whether or not n2/n1≧R is checked (step S706).

In step S706, if determined to be [YES], the code table and the context tree are initialized, and a value of (m) is set to "0" (step S707).

Then, the value of R is set to n2/n1 (step S708).

In step S706, if determined to be [NO], the value of R is set to "1" (step S709).

After executing the processes in steps S708 and S709, values of n1 and n2 are set to "0" (step S710).

Herein, if determined to be [NO] in step S705, the value of n1 is incremented by "1" (step S711).

After performing the processes in steps S710 and S711, whether or not the symbol K is registered in the code table of the context P is checked (step S712).

In step S712, if determined to be [registered], the code of the symbol K is outputted by use of the code table of the context P (step S713).

Then, the value of n2 is incremented by a code length of K (step S714).

Subsequently, the code table of the context P is updated to shorten the code of the symbol K that has been previously code-outputted (step S715).

Then, the context $P_0$ is updated by adding the symbol K (step S716).

Ensuingly, whether or not all the characters are terminated is checked (step S717).

If determined to be [unterminated] in step S717, the processing returns to step S703.

Whereas if determined to be [terminated] in step S717, the processing comes to an end.

On the other hand, if determined to be [unregistered] in step S712, the ESC code is outputted (step S718).

Then, the value of n2 is incremented by the code length of ESC (step S719).

Then, the code table is updated to shorten the code length of ESC which has been previously been code-outputted (step S720).

Herein, whether $m \geq M$ or not is checked (step S721).

If determined to be [NO] in step S721, the symbol K is newly registered in the code table of the context P, and (m) is incremented by "1" (step S722).

If determined to be [YES] in step S721, and after executing the process in step S722, the context P is changed (step S723), and the processing goes back to step S705.

The processes described above are repeated with respect to all the inputted characters.

Figure 11:
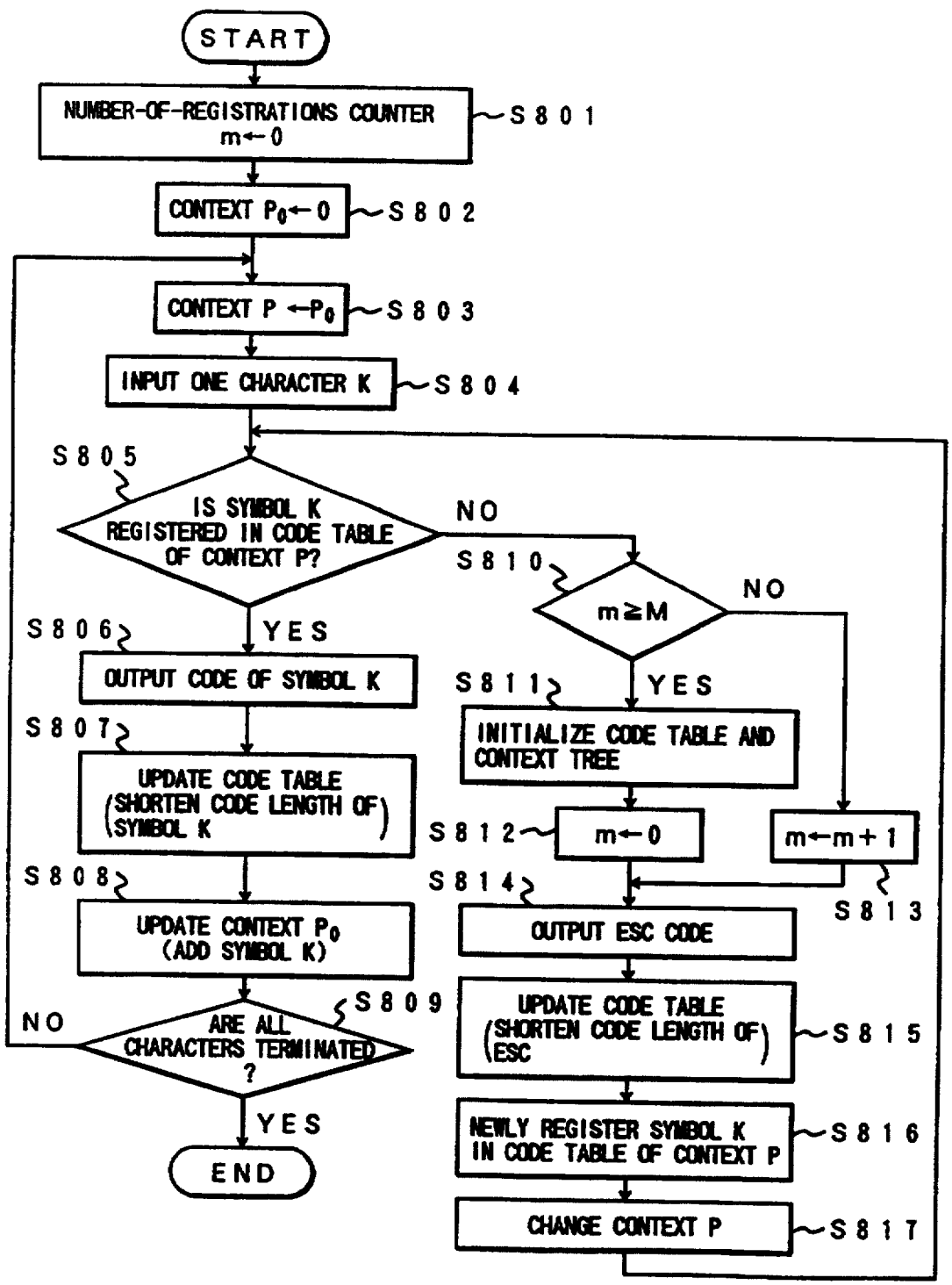
FIG. 11 is a flowchart showing processes of the data compressing method of the statistical coding by executing the initialization for every fixed number of registrations.

Next, FIG. 11 is a flowchart showing processes of the data compressing method of performing the probability statistic adaptive type coding by executing the deleting process with a such a content that the initialization is effected when reaching a fixed count value in the case of counting a total number of registered tuples.

At first, "0" is set in (m) corresponding to a number-of-registrations counter (step S801).

Next, "0" is set in the context $P_0$ (step S802).

Subsequently, the context $P_0$ is inputted to the variable P (context) (step S803). Checked is whether or not the symbol K is registered in the code table of the context P (step S805).

In step S805, if determined to be [registered], the code of the symbol K is outputted (step S806).

Then, the code table of the context P is updated to shorten the code of the symbol K that has been previously code-outputted (step S807).

Then, the context $P_0$ is updated by adding the symbol K (step S808).

Subsequently, whether or not all the characters are terminated is checked (step S809).

If determined to be [unterminated] in step S809, the processing returns to step S803.

Whereas if determined to be [terminated] in step S809, the processing is ended.

On the other hand, if determined to be [unregistered] in step S805, whether $m \geq M$ or not is checked (step S810).

In step S810, if determined to be [YES], the code table and the context tree are initialized (step S811).

Then, the value of (m) is set to "0" (step S812).

In step S810, if determined to be [NO], the value of (m) is incremented by "1" (step S813).

After executing the processes in steps S812, and S813, the ESC code is outputted (step S814).

Then, the code table is updated to shorten the code of ESC that has been previously code-outputted (step S815).

Subsequently, the symbol K is newly registered in the code table of the context P (step S816).

Then, the context P is updated (step S817), and the processing returns to step S805. That is, the above processes are repeated till the inputted characters disoccur.

(Third Embodiment)

A third embodiment is concerned with the data compressing method of performing the probability statistic adaptive type coding by executing a partial deleting process.

According to the partial deleting process, in processes relative to the outputting of the code and the updating of the code table, if K| P is not registered in the context tree, the symbol K is newly registered in the code table of the context P, and further the previous tuple (K| P) is also registered in a deleting order list. Moreover, when updating the code table, the deleting order list is updated to increase the deleting order of the coded character. When deleted (for example, each time a fixed quantity of characters are coded), the tuple having a low order is deleted from the code table and the context tree in accordance with the deleting order list.

Figure 12:
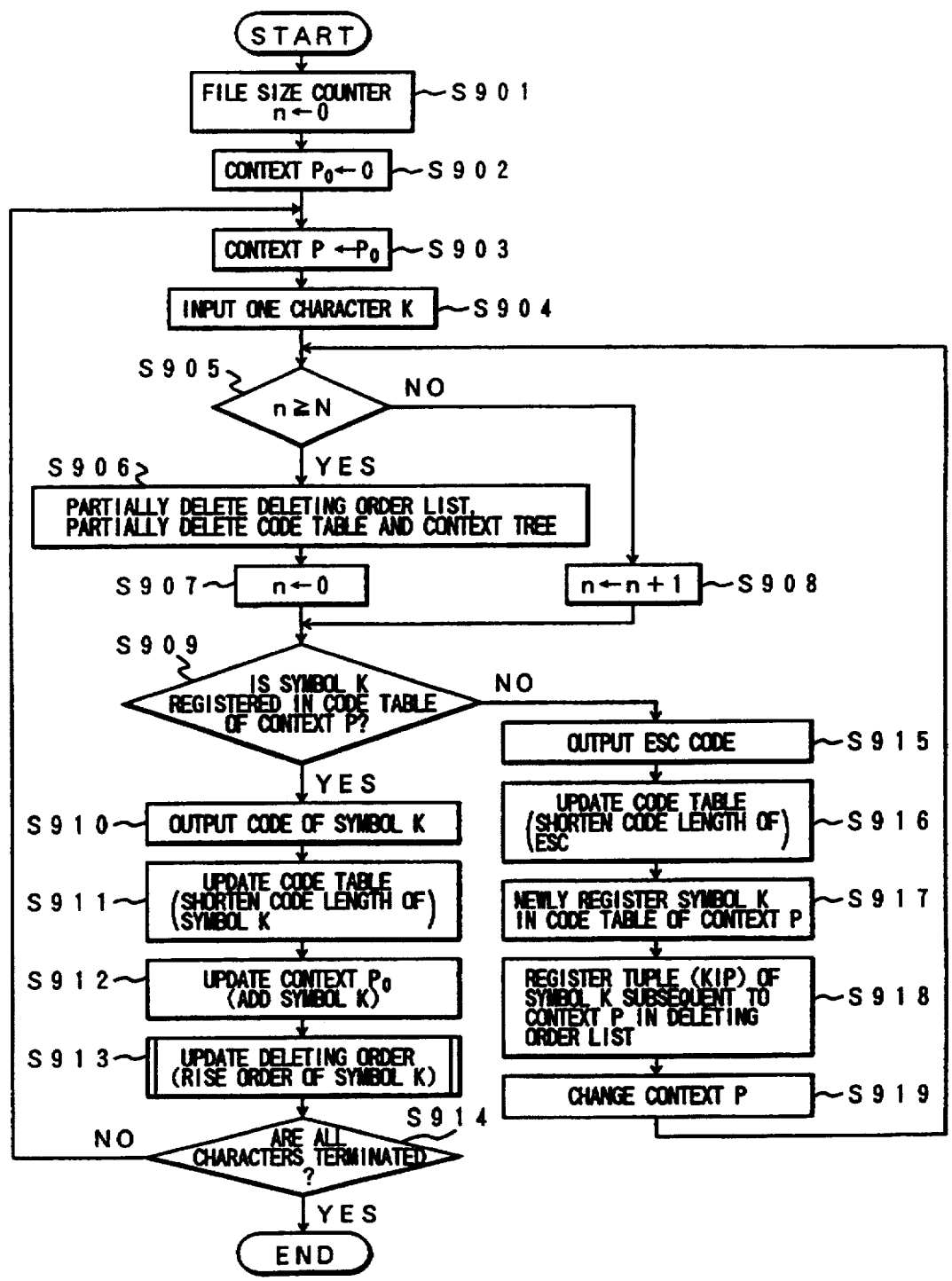
FIG. 12 is a flowchart showing processes of the data compressing method of the statistical coding by executing a partial deletion for every fixed file size in the third embodiment.

FIG. 12 is a flowchart showing processes of the data compressing method of performing the probability statistic adaptive type coding by executing the partial deleting process with a such a content that the partial deleting process is conducted per fixed file size.

At first, the value of (n) corresponding to a file counter is set to "0" (step S901).

Next, "0" is set in the context $P_0$ (step S902).

Subsequently, the context $P_0$ is inputted to the variable P (context) (step S903). When the symbol K is inputted (step S904), whether $n \geq N$ or not is checked (step S905).

If determined to be [YES] in step S905, the deleting order list is partially deleted, and the code table and the context tree are partially deleted (step S906).

Then, the value of (n) is set to "0" (step S907).

In step S905, whereas if determined to be [NO], the value of (n) is incremented by "1" (step S908).

After performing the processes in steps S907 and S908, whether or not the symbol K is registered in the code table of the context P is checked (step S909).

In step S909, if determined to be [YES], the code of the symbol K is outputted (step S910).

Then, the code table is updated to shorten the code of the symbol K which has been previously code-outputted (step S911).

Then, the context $P_0$ is updated by adding the symbol K (step S912).

Subsequently, the deleting order is updated to rise the order of the symbol K (step S913).

Then, whether or not all the characters are terminated is checked (step S914).

If determined to be [unterminated] in step S914, the processing returns to step S903.

Whereas if determined to be [terminated] in step S914, the processing is finished.

If determined to be [YES] in step S909, the ESC code is outputted (step S915).

Then, the code table is updated to shorten the code of ESC that has been previously code-outputted (step S916).

Subsequently, the symbol K is newly registered in the code table of the context P (step S917).

Then, the tuple (K| P) of the symbol K subsequent to the context P is registered in the deleting order list (step S918).

Ensuingly, the context P is updated (step S919), and the processing goes back to step S905. That is, the above processes are repeated till the inputted characters disappeared.

Figure 13A:
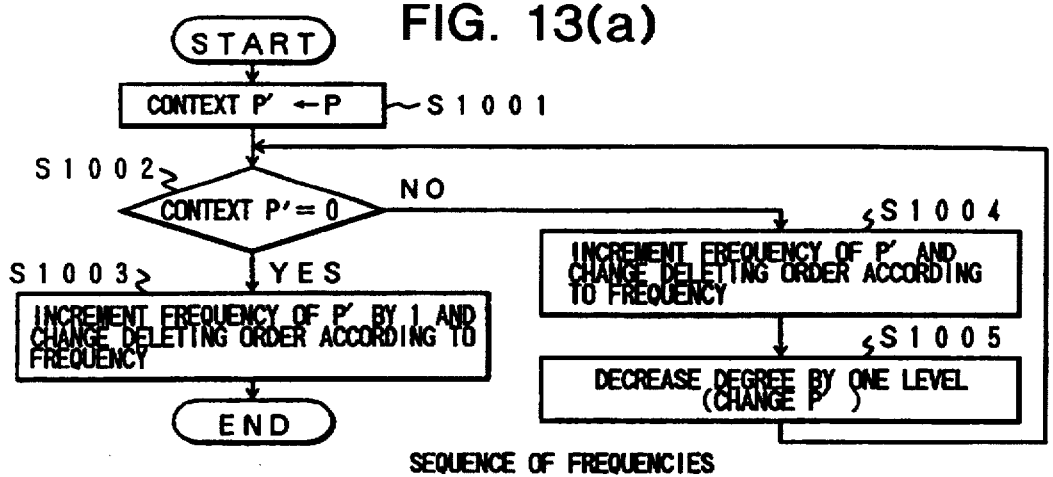
FIG. 13(a) shows a case of effecting the updating in the sequence of frequencies.

Next, FIG. 13(a) is a flowchart showing processes of the data compressing method of performing the probability statistic adaptive type coding by executing the partial deleting process with a such a content that the deleting order list is updated in the rank of frequencies.

To start with, the context P is copied into a context P' (step S1001).

Next, whether the context P' is "0" or not is checked (step S1002).

If determined to be [YES] in step S1002, a frequency of P' is incremented by "1", and the deleting rank is changed corresponding to the frequency (step S1003).

Whereas if determined to be [NO] in step S1002, the frequency of P' is incremented by "1", and the deleting rank is changed corresponding to the frequency (step S1004).

Then, the order is decremented by 1, thereby changing P' (step S1005), and the processing returns to step S1002.

Figure 14A:
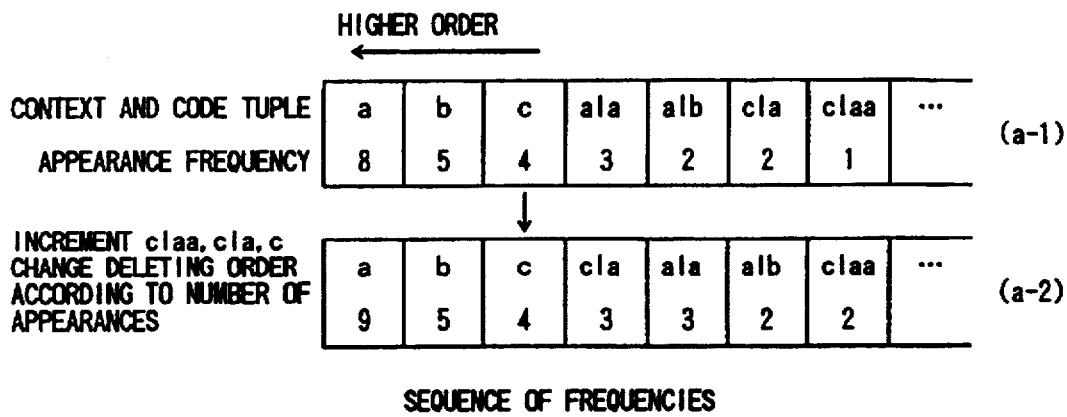
FIG. 14(a) shows a case in the sequence of frequencies.

FIG. 14(a) illustrates how the deleting rank list is updated according to the rank of frequencies when encoded with "cl aa". At first, with respect to the characters, the code tuples and the occurrence frequencies, "a" is 8, "b" is 5, "c" is 4, "al a" is 3, "al b" is 2, "cla" is 2, and "cl aa" is 1. In this case, the deleting rank list is, as illustrated in FIG. 14(a-1), structured in such a way that the elements are arranged in the sequence from a larger occurrence frequency. Herein, if the character c occurs subsequent to the context "aa", the occurrence frequencies of "cl aa", "cl a" and "c" are each incremented by 1, and the deleting rank list is such that the elements are, as shown in (a-2) of FIG. 14, rearranged in a sequence such as "a", "b", "c", "cl a", "al a", "al b" and "cl aa".

Figure 13B:
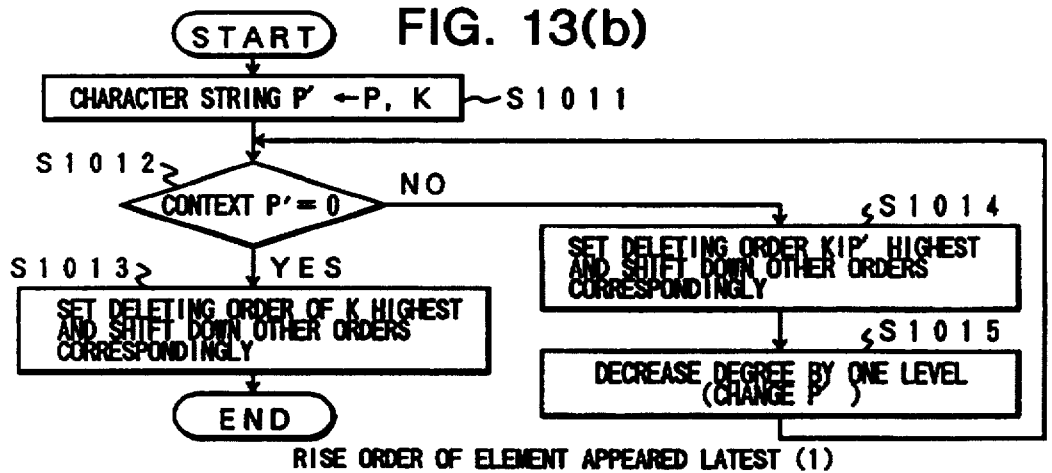
FIG. 13(b) shows a case (part 1) of rising the rank of an element occurred latest.

Next, FIG. 13(b) is a flowchart (part 1) showing processes of the data compressing method of performing the probability statistic adaptive type coding by executing the partial deleting process with a such a content that the deleting rank list is updated to rise the order of the element occurred latest.

To begin with, the contexts P, K are copied into the context P' (step S1011).

Next, whether the context P' is "0" or not is checked (step S1012).

If determined to be [YES] in step S1012, the deleting rank of K is set highest, and, with this setting, other ranks are shifted down (step S1013).

If determined to be [NO] in step S1012, the deleting rank of Kl P' is set highest, and, with this setting, other ranks are shifted down (step S1014).

Then, the order is decremented by 1, thereby changing P' (step S1015), and the processing returns to step S1012.

Figure 14B:
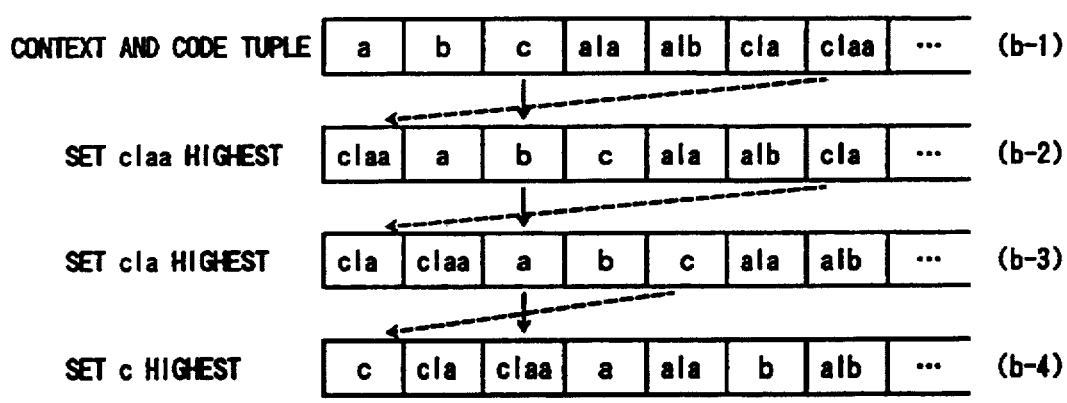
FIG. 14(b) shows a case (part 1) of rising the rank of an element occurred latest.

FIG. 14(b) illustrates how the deleting rank list is updated so that the rank of the element occurred latest rises. At first, the deleting order list is structured so that the elements are, as illustrated in (b-1) of FIG. 14, arranged in the sequence such as "a", "b", "c", "al a", "al b", "cl a" and "cl aa". If the character "c" occurs subsequent to the context "aa", the elements in the deleting rank list are rearranged as in the sequence of (b-2), (b-3) and (b-4). That is, the rearrangement in (b-2) is that "cl aa" is of the highest rank, but other elements are arranged in the sequence of (b-1). The rearrangement in (b-3) is that "cl a" is of the highest rank, but other elements are arranged in the sequence of (b-2). Then, the rearrangement in (b-4) is that "c" is of the highest rank, but other elements are arranged in the sequence of (b-3).

Figure 13C:
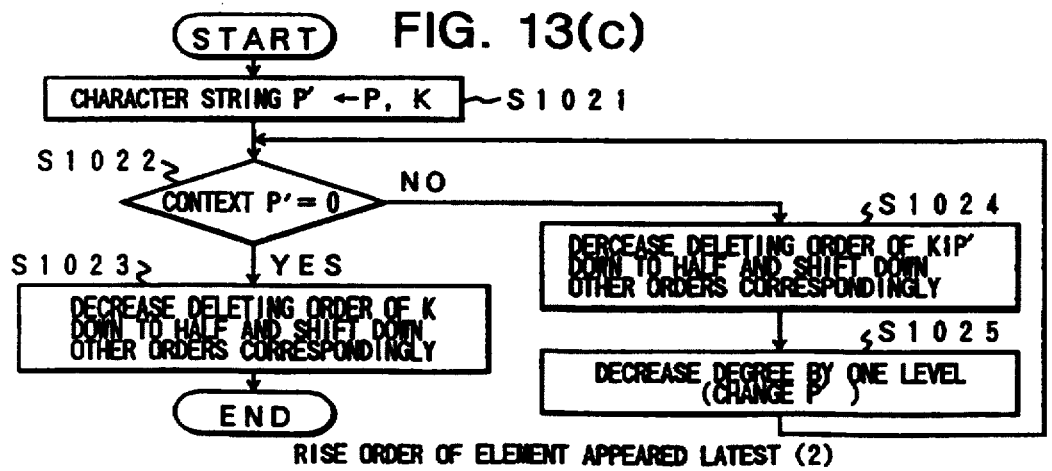
FIG. 13(c) shows a case (part 2) of rising the rank of the element occurred latest.

Next, FIG. 13(c) is a flowchart (part 2) showing processes of the data compressing method of performing the probability statistic adaptive type coding by executing the partial deleting process with a such a content that the deleting rank list is updated to rise the rank of the element occurred latest.

At first, the contexts P, K are copied into the context P' (step S1021).

Next, whether the context P' is "0" or not is checked (step S1022).

If determined to be [YES] in step S1022, the deleting rank of K decreases down to a half, and, with this process, other ranks are shifted down (step S1023).

Whereas if determined to be [NO] in step S1022, the deleting rank of Kl P' decreases down to a half, and, with this process, other ranks are shifted down (step S1024).

Then, the order is decremented by 1, thereby changing P' (step S1025), and the processing returns to step S1022.

Figure 14C:
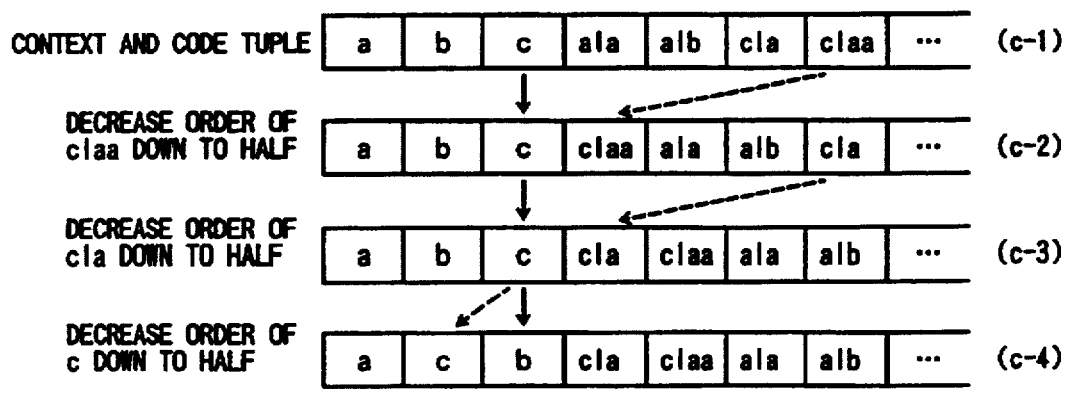
FIG. 14(c) shows a case (part 2) of rising the rank of the element occurred latest.

FIG. 14(c) illustrates how the deleting rank list is updated when encoded with "cl aa" so that the rank of the element occurred latest rises. At first, the deleting order list is structured so that the elements are, as illustrated in (c-1) of FIG. 14, arranged in the sequence such as "a", "b", "c", "al a", "al b", "cl a" and "cl aa". Herein, if the character "c" occurs subsequent to the context "aa", the elements in the deleting rank list are rearranged in the sequence of (c-2), (c-3) and (c-4). That is, in (c-2), the rank of "cl aa" decreases down to a half, and other elements are rearranged as in the sequence of (c-1). In (c-3), the rank of "cl a" decreases down to a half, and other elements are rearranged in the sequence of (c-2). Then, in (c-4), the rank of "c" decreases down to a half, and other elements are rearranged in the sequence of (c-3). Then, in (c-4), the rank of "c" decreases down to a half, and other elements are rearranged in the sequence of (c-3).

(Fourth Embodiment)

A fourth embodiment is concerned with the data compressing method of performing the probability statistic adaptive type coding by executing a process of combining a full deletion with the partial deletion.

The execution of the probability statistic adaptive type coding by performing the process of combining the full deletion with the partial deletion involves deleting, when making a new registration after the total number of registered tuples, one of the low-order tuples according to the deleting rank list out of the code table and the context tree and instead registering a new tuple but effecting, if a compression ratio decreases, the full deletion.

Figure 15:
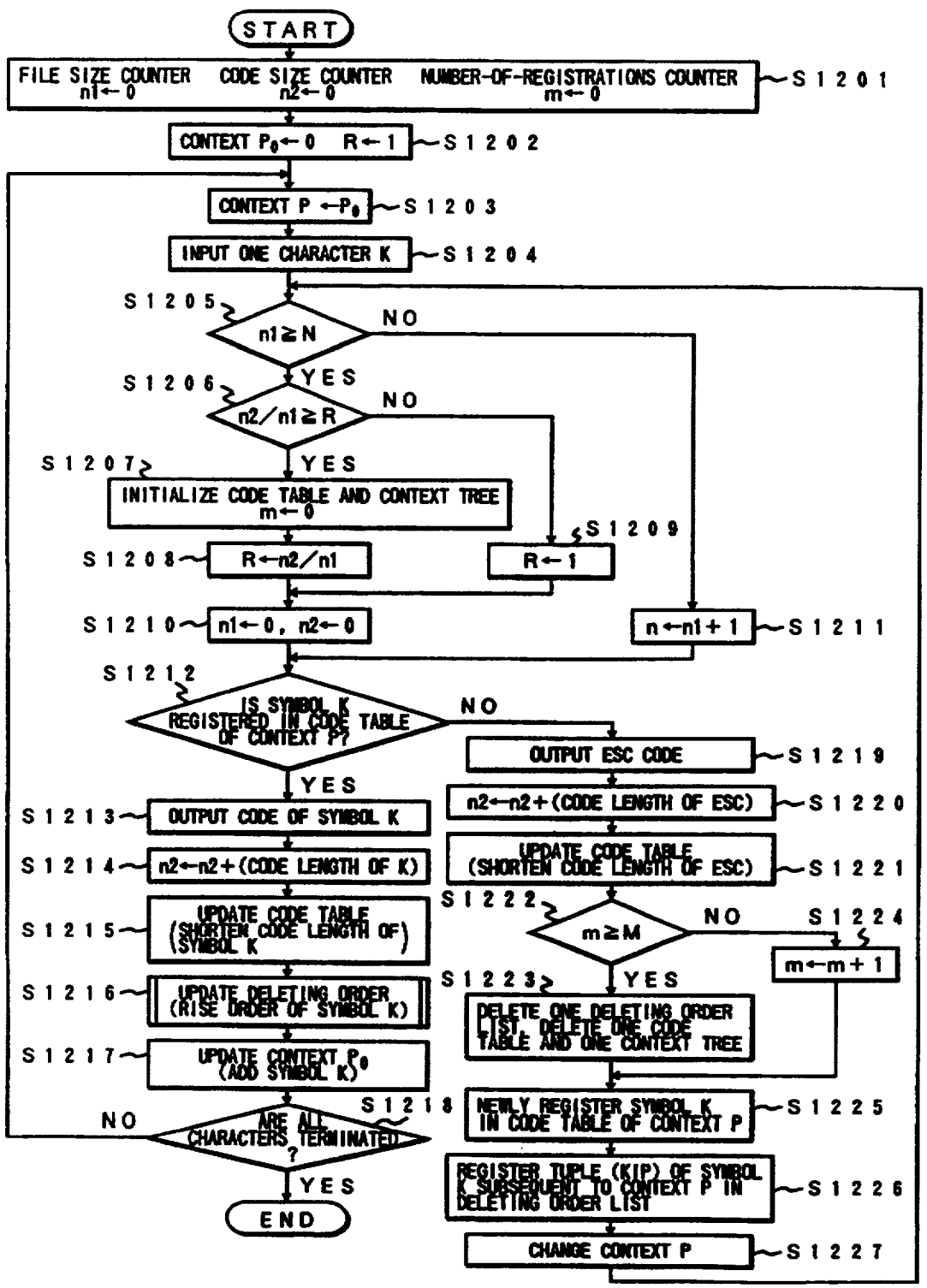
FIG. 15 is a flowchart showing processes of the data compressing method of the statistical coding by executing a process of combining the initialization with the partial deletion in a fourth embodiment.

FIG. 15 is a flowchart showing processes of the data compressing method carried out in the fourth embodiment.

First, the value of n1 corresponding to the file size counter is set to "0", the value of n2 corresponding to the code size counter is set to "0", and the value of (m) corresponding to the number-of-registrations counter is set to "0", respectively (step S1201).

Next, the context $P_0$ is set to "0", while the value of R is set to "1", respectively (step S1202).

Subsequently, the context $P_0$ is inputted to the variable P (context) (step S1203). When the symbol K is inputted (step S1204), whether n1≧N or not is checked (step S1205).

If determined to be [YES] in step S1205, whether n2/n1≧R or not is checked (step S1206).

If determined to be [YES] in step S1206, the code table and the context tree are initialized, and the value of (m) is set to "0" (step S1207).

Then, the value of R is set to n2/n1 (step S1208).

If determined to be [NO] in step S1206, the value of R is set to "1" (step S1209).

After executing the processes in steps S1208 and S1209, the values of n1 and n2 are set to "0" (step S1210).

Herein, if determined to be [NO] in step S1205, the value of n1 is incremented by "1" (step S1211).

After performing the processes in steps S1210 and S1211, whether or not the symbol K is registered in the code table of the context P is checked (step S1212).

In step S1212, if determined to be [registered], the code of the symbol K is outputted (step S1213).

Then, the value of n2 is incremented by the code length of K (step S1214).

Subsequently, the code table is updated to shorten the code of the symbol K which has been previously code-outputted (step S1215).

Then, the deleting rank is updated to rise the rank of the symbol K (step S1216).

Then, the context $P_0$ is updated by adding the symbol K (step S1217).

Subsequently, whether or not all the characters are terminated is checked (step S1218).

If determined to be [unterminated] in step S1218, the processing returns to step S1203.

Whereas if determined to be [terminated] in step S1218, the processing is finished.

On the other hand, if determined to be [unregistered] in step S1212, the ESC code is outputted (step S1219).

Then, the value of n2 is incremented by the code length of ESC (step S1220).

Ensuingly, the code table is updated to shorten the code length of ESC that has been previously code-outputted (step S1221).

Herein, whether m≧M or not is checked (step S1222).

If determined to be [NO] in step S1222, one of the rank lists is deleted as well as deleting one code table and one context tree (step S1223).

Whereas if determined to be [YES] in step S1222, the value of (m) is incremented by 1 (step S1224).

After executing the processes in steps S1223 and S1224, the symbol K is newly registered in the code table of the context P (step S1225).

Then, the tuple (Kl P) of the symbol K subsequent to the context P is registered in the deleting rank list (step S1226).

Subsequently, the context P is changed (step S1227), and the processing returns to step S1205. That is the processes given above are repeated till the inputted characters disappear.

(Fifth Embodiment)

A fifth embodiment is concerned with the data compressing method of performing multivalued arithmetic coding by executing the deleting process with such a content that the context tree is deleted.

FIG. 16 illustrates a context tree deleting method carried out in the fifth embodiment.

Executed at first is the deletion from a branch with a less number of occurrences so that a sum number of occurrences of the character subsequent to the same context from a lower order becomes ½. Referring to FIG. 16, first, at the 0th order, "a" and subsequent characters are deleted so that the sum comes to 5000. Next, at the first order, the branches are deleted so that the sum similarly comes to ½.

The above processes are repeated up to the highest order (second order in this embodiment). Thereafter, the numbers of occurrences of children left after the deletion are each divided by 8, and values under 1 are set to 1.

Note that the division of the number of occurrences by 8 is one example, but the divisor may be one of multiples of 2.

<Effects of First through Fifth Embodiments>

Effects of the first through fifth embodiments will be explained with reference to FIGS. 17 through 20. Incidentally, referring to FIGS. 17 through 20, (a) shows variations in a rate of tuples unused for coding among the registered tuples, while (b) shows variations in a rate of the inputted characters that could be encoded with a high-order (the maximum is, however, the second order). Then, (a) gives such a significance that the dictionary memory can be utilized more effectively with a smaller number of unused tuples, while (b) gives such a significance that a higher compression ratio is obtained as a high-order coding rate increases.

Figure 17A:
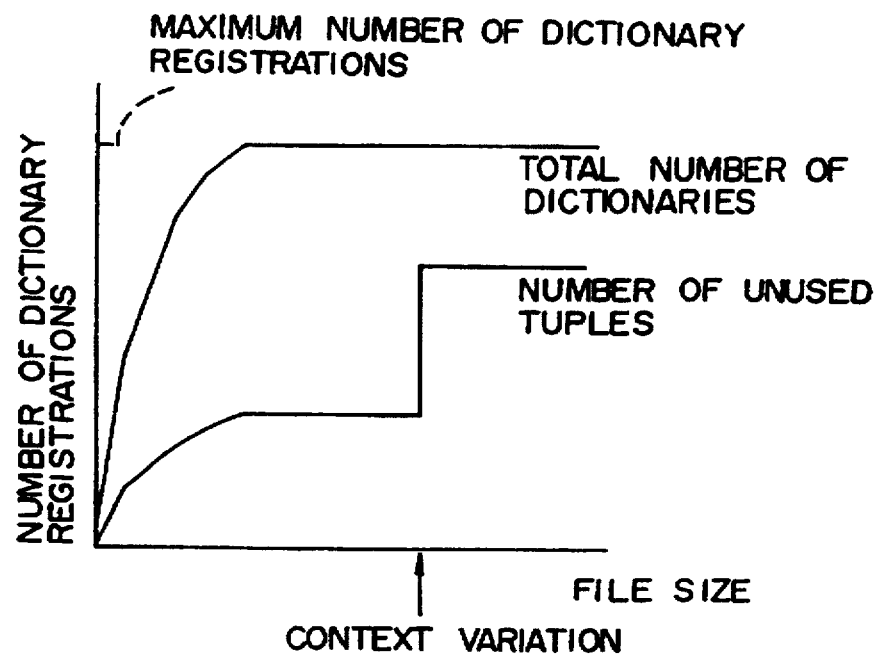
FIG. 17(a) shows a rate of unused tuples among those registered.
Figure 17B:
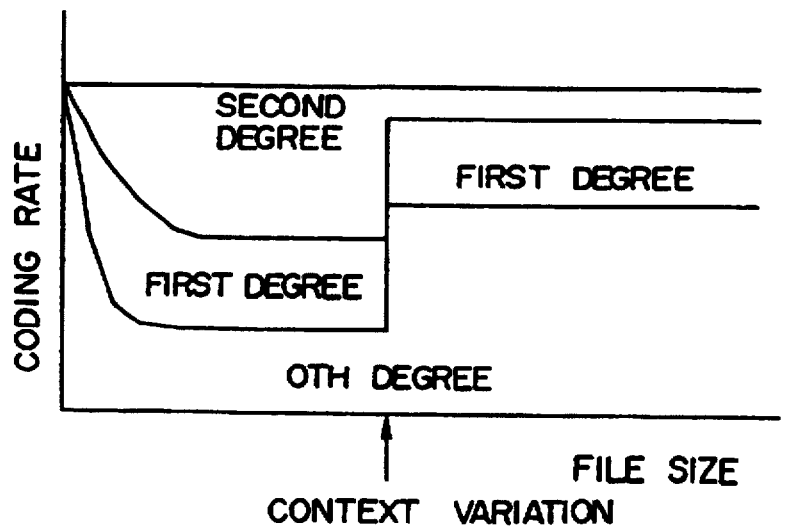
FIG. 17(b) shows a rate of coding at each order.

At first, FIG. 17 is a graph showing a relationship between the file size, the number of dictionary registrations and the coding rate in the case of the full registration non-deletion that has hitherto been practiced, i.e., in the case of sequentially registering all combinations of coding target characters with the occurred contexts in the context tree and the code table but, after being registered up to a memory limit, performing no new registration and thus updating an already-registered code note. As shown in FIG. 17(a), in steady data (a statistic quantity of each character is fixed) with no variation in the context, there gradually increases the number of unused tuples among the tuples registered with the dictionary registrations, but an unused rate occupying the total number of registered dictionaries decreases little by little and becomes fixed just when reaching the dictionary memory limit. Further, as shown in FIG. 17(b), the high-order coding rate gradually increases with the dictionary registrations but is kept constant after the dictionary has been fixed. Then, when the context changes, the unused rate rises, whereas the high-order coding rate decreases.

Figure 18A:
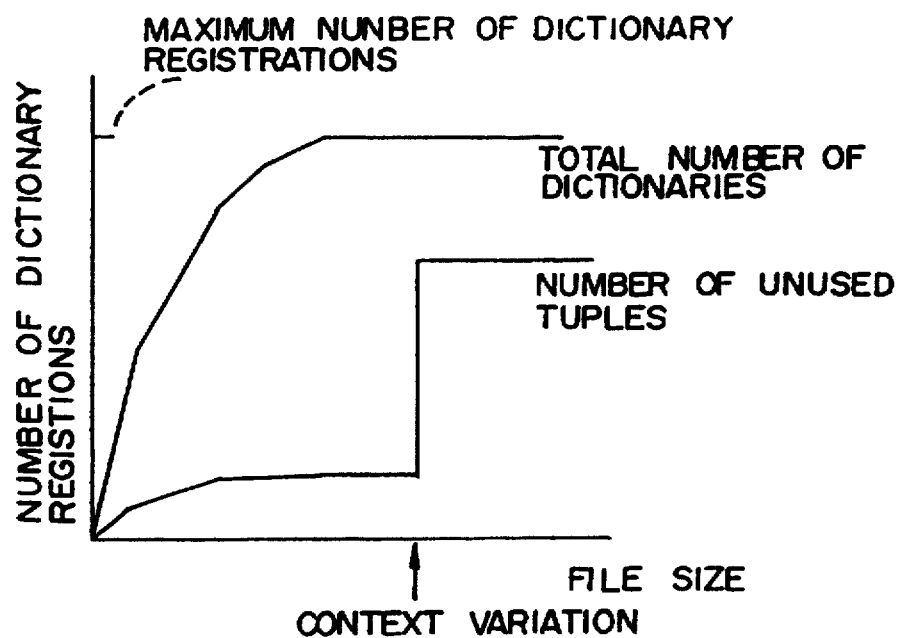
FIG. 18(a) shows a rate of unused tuples among those registered.
Figure 18B:
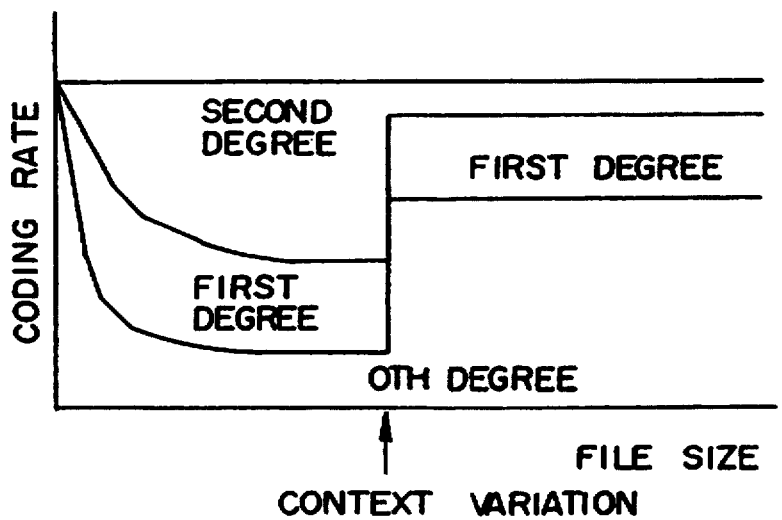
FIG. 18(b) shows a rate of coding at each order.

Next, FIG. 18 is a graph showing a relationship between the file size, the number of dictionary registrations and the coding rate in the case of restricting the registration but performing no deletion. As illustrated in FIG. 18(a), the registration is restricted, and, hence, an increasing order of the total number of dictionary registrations is more moderate than in the prior art (see FIG. 17). Also, as shown in FIG. 18(b), in the steady data, the unused rate is smaller than in the conventional case (see FIG. 17), whereas the high-order coding rate becomes larger than in the prior art. Then, as in the conventional case where the context change happens, the unused rate increases, whereas the high-order coding rate decreases.

Figure 19A:
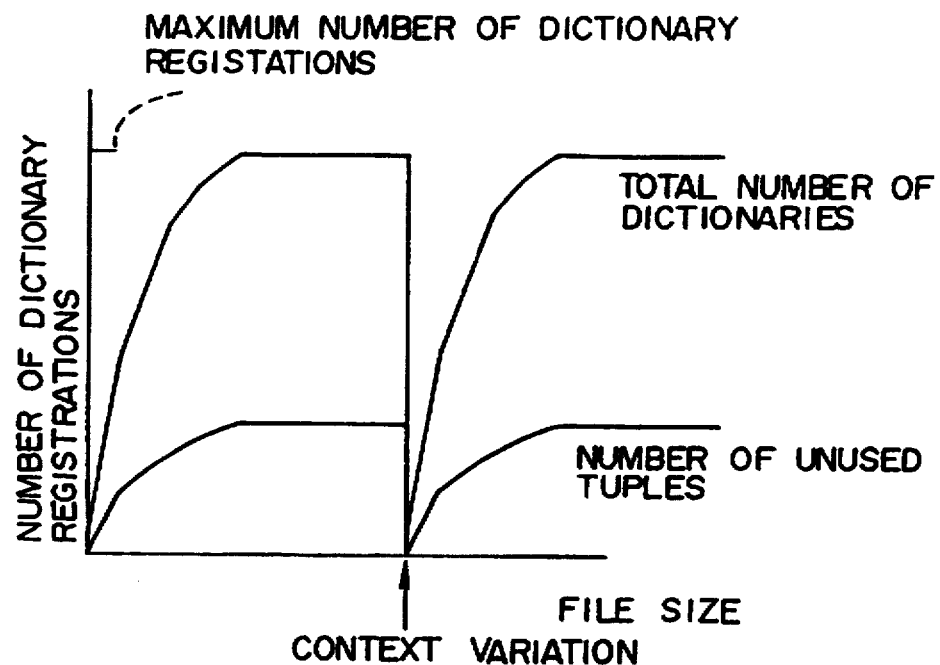
FIG. 19(a) shows a rate of unused tuples among those registered.
Figure 19B:
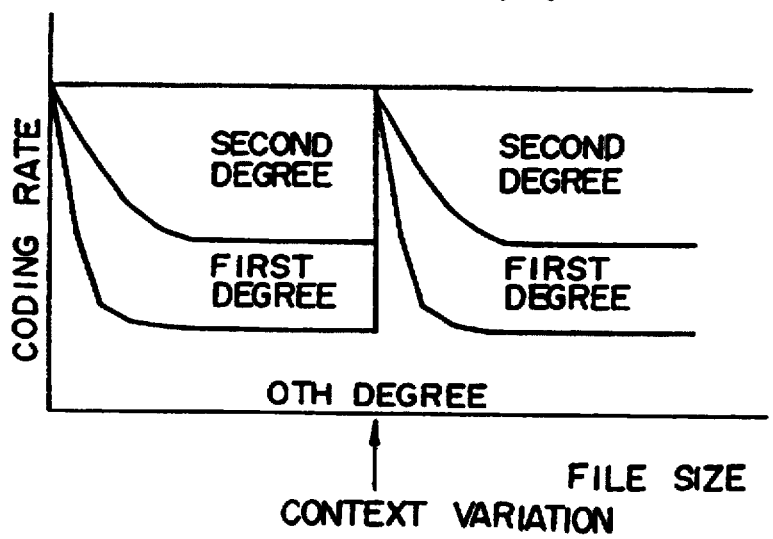
FIG. 19(b) shows a rate of coding at each order.

Next, FIG. 19 is a graph showing a relationship between the file size, the number of dictionary registrations and the coding rate when performing both the full registration and the full deletion. According to the registering method taken herein, as in the conventional case, the dictionary is fully cleared when the context change happens. After clearing the dictionary, the total number of dictionary registrations increases when the file size augments with the input of the file, but the registration is stopped just when the dictionary memory comes to its limit. As shown in FIG. 19(a), the unused rate occupying the total number of registered dictionaries decreases little by little with the dictionary registrations and becomes fixed just when reaching the dictionary memory limit. Further, as shown in FIG. 19(b), the high-order coding rate gradually increases with the dictionary registrations but is kept constant after the dictionary has been fixed. There arises a state adaptable to the variations in the context by effecting the deletion in this manner.

Figure 20A:
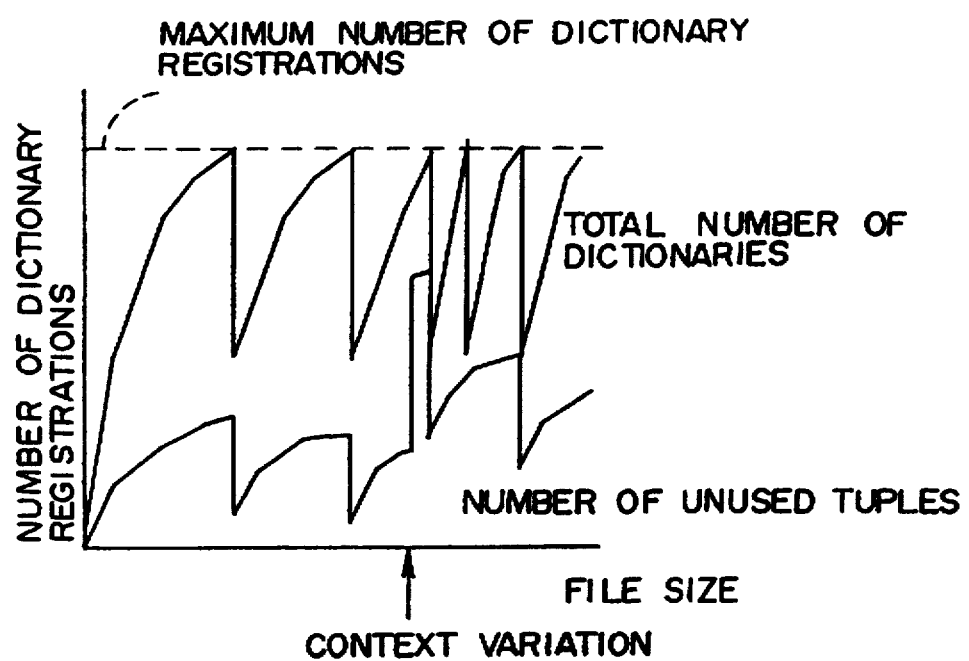
FIG. 20(a) shows a rate of unused tuples among those registered.
Figure 20B:
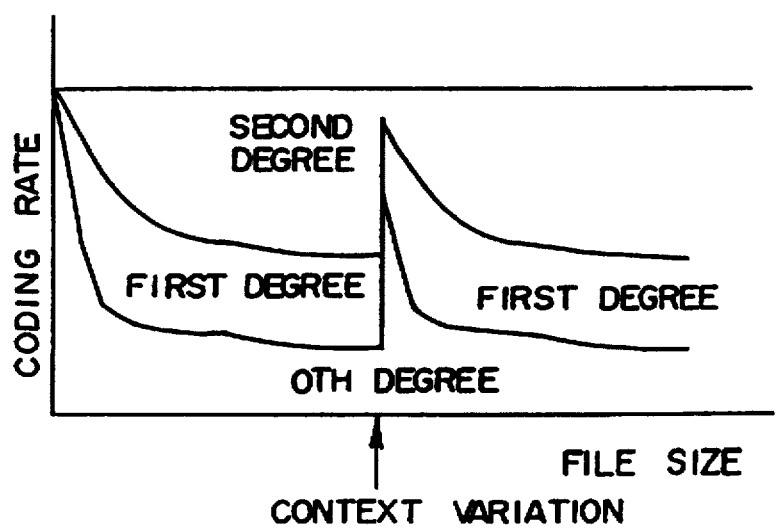
FIG. 20(b) shows a rate of coding at each order.

Next, FIG. 20 is a graph showing a relationship between the file size, the number of dictionary registrations and the coding rate when performing both the full registration and the partial deletion. The deletion herein implies that the dictionary is cleared half just when the dictionary comes to its limit. As shown in FIG. 20(b), in the steady data, the unused rate gradually becomes smaller than in the conventional case, but, with this decrease, the high-order coding rate increases. There arises the state adaptable to the variations in the context by effecting the partial deletion.

(Sixth Embodiment)

A sixth embodiment is concerned with the data compressing method and a data compressing apparatus for performing blending splay coding by making use of a blending model where ESC is not registered in the context tree but by registering no ESC in the code tree.

Referring first to FIG. 5, the context tree used for the conventional blending model will be explained. Referring next to FIG. 21, the context tree used for a blending model in the sixth embodiment will be described.

Figure 2A:
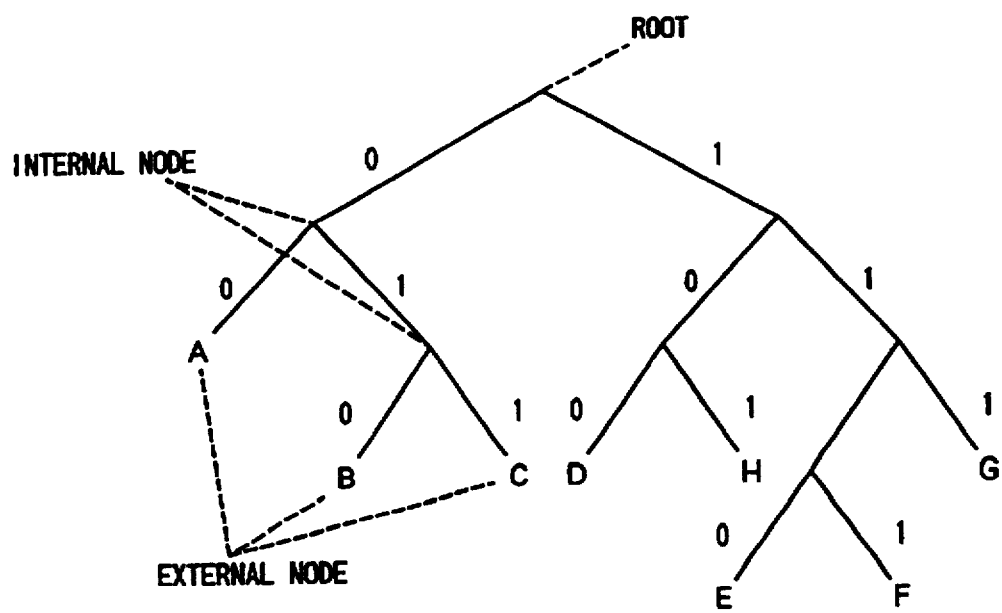
FIG. 2(a) shows an example of a code tree used for the splay coding.
Figure 2B:
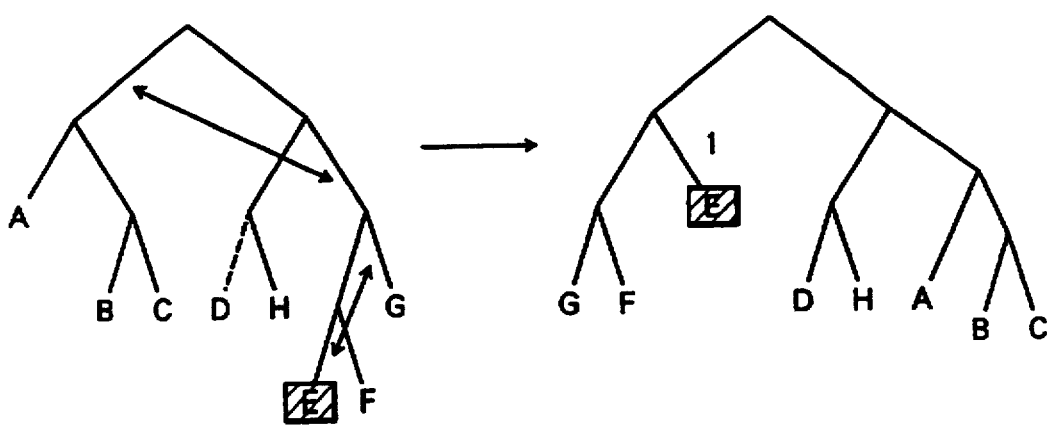
FIG. 2(b) shows an example of a splay process executed for the splay coding.
Figure 3A:
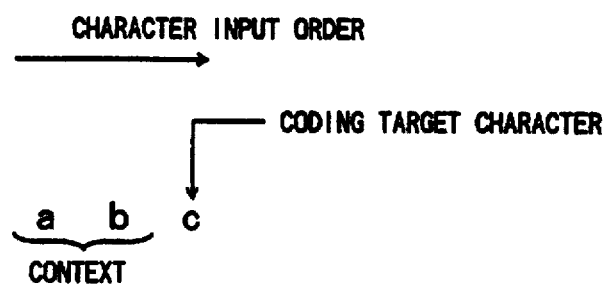
FIG. 3(a) shows a context and a coding target character.
Figure 3B:
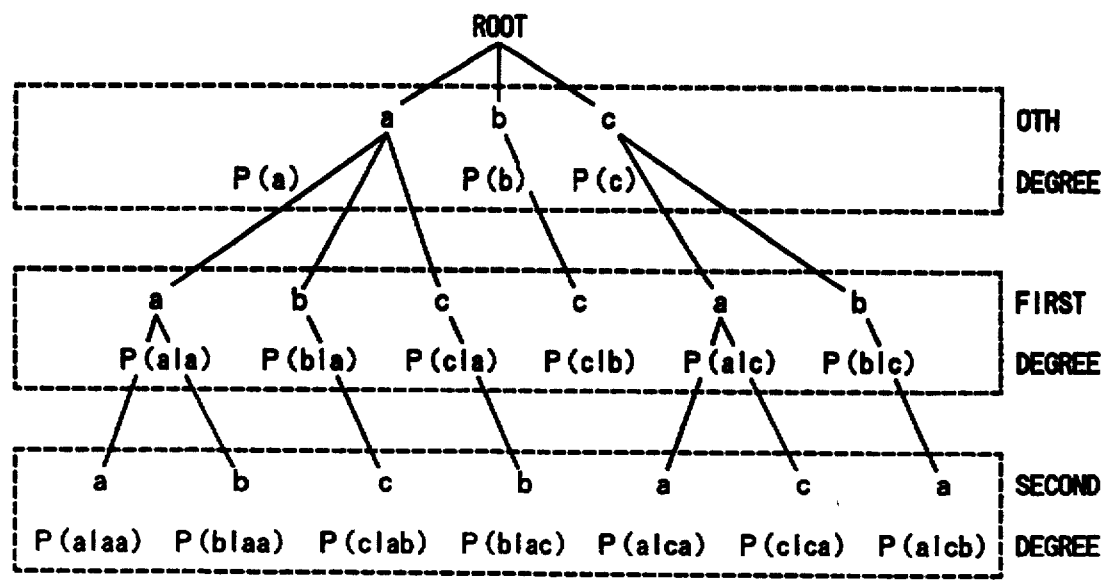
FIG. 3(b) shows the context tree and an occurrence probability of each character.
Figure 4A:
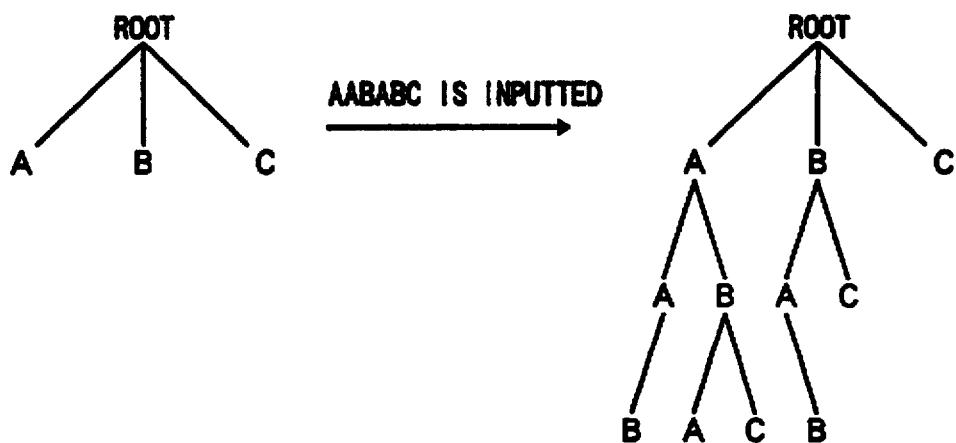
FIG. 4(a) shows an example of a full registration type.
Figure 4B:
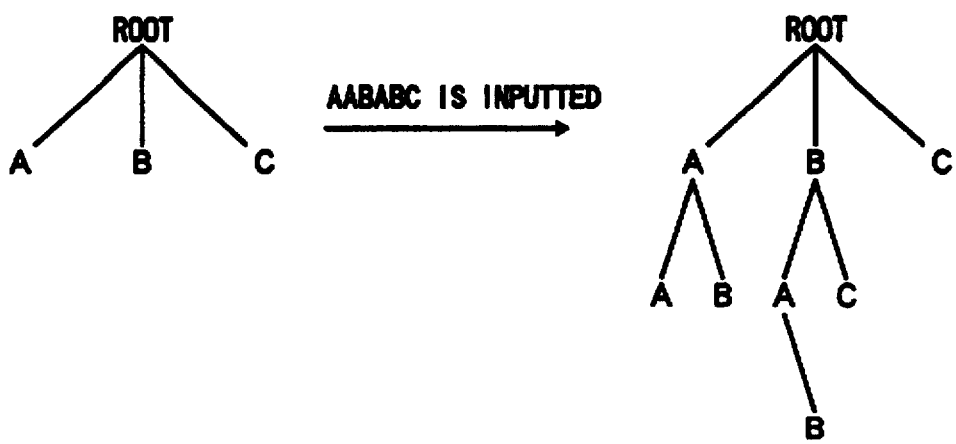
FIG. 4(b) shows an example of a sequential registration type.
Figure 5A:
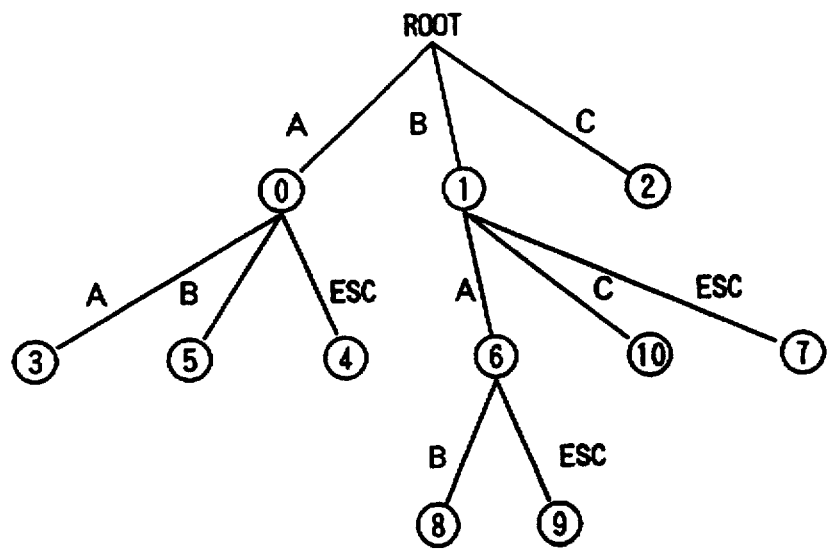
FIG. 5(a) illustrates the context tree.

At first, a multiplicity of ESCs are, as shown in FIG. 5(a), registered in the context tree employed for the conventional blending model. These ESCs represent unoccurred characters and are used for indicating that these characters connected to the contexts are not registered. For example, C connected to a second-order context BA is not registered in the context tree illustrated in FIG. 5(a), and, therefore, if C connected to the second-order context BA is searched, second-order ESC is to be outputted.

Herein, a node registered with the second-order ESC is, as in the case of FIG. 5(a), marked with an index 9. A character string registered in the node with this index 9 is BA, and a code tree root to which it belongs is 1root (BA) (1root=local root).

On the other hand, a node marked with an index 6 in the same context tree corresponds to a node obtained as a result of searching A connected to a first-order context B. The context and the character connected to this context are similarly BA, and the root of the code tree to which the character belongs is 1root(B). The node with the index 6 corresponds to A in BA.

The same character string corresponds to the two nodes, but their meanings are different. That is, the former example means that the node, index 6, corresponding to "A" became a parent of the node, indexed a, corresponding to ESC, while the latter one means that the node, indexed b, corresponding to "A" became a child of the node, indexed 1, corresponding to "B".

Figures 21A, 21B:
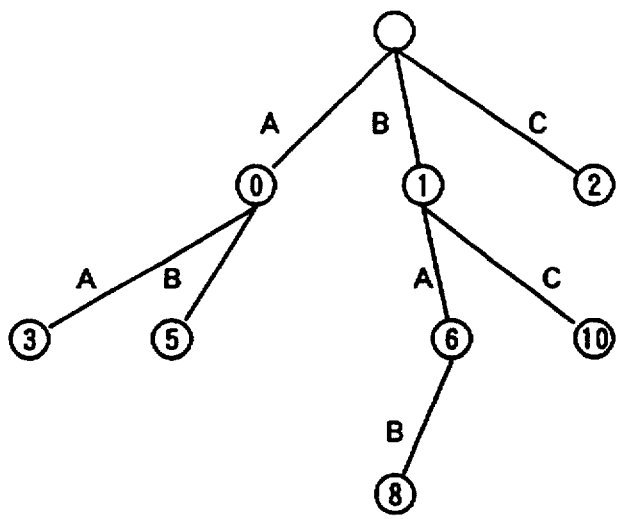
FIG. 21(a) shows an example of the context tree.
FIG. 21(b) shows the example of the contents registered.

Herein, it is assumed that ESC belongs to the node of the parent thereof, and when removing ESC from the context tree of FIG. 5(a), this turns out to be a context tree illustrated in FIG. 21(a). The context tree shown in FIG. 21(a) is registered with no ESC, but, instead, in the conventional blending model, a content of ESC is registered together in the node (e.g., the node with the index 6 in FIG. 5(a)) wherein ESC is registered as its child (see FIG. 21(b)). In the example of FIG. 21(b), "BAB" is registered as a character string in a node with the index 8; "0" (indicating that this is a leaf) is registered as a root of the code tree corresponding to a second coding (decoding) process target context indicated by the node; and 1root (BA) is registered as a root of the code tree corresponding to a coding (decoding) process target context conceived as a parent of the node.

Figure 22:
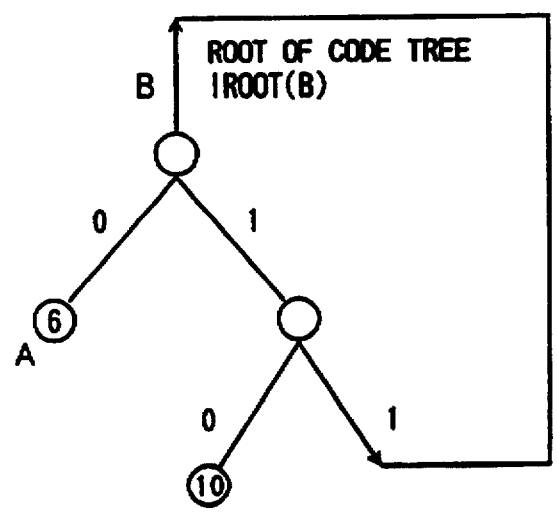
FIG. 22 is a diagram illustrating a code tree in the sixth embodiment.

Next, referring to FIG. 5, the code tree used for the conventional blending splay coding will be explained. Referring next to FIG. 22, the code tree employed for the blending splay coding in the sixth embodiment will be described.

Figure 5B:
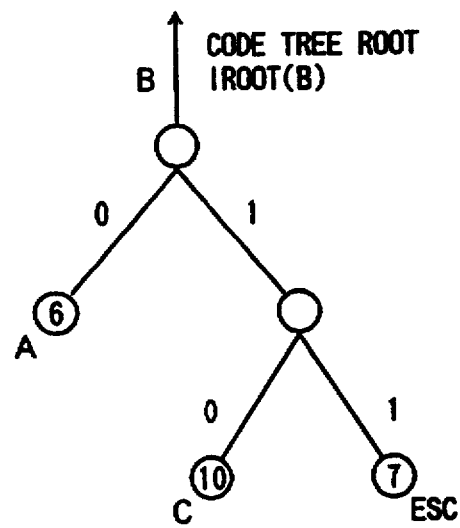
FIG. 5(b) illustrates the code tree.
Figure 6A:
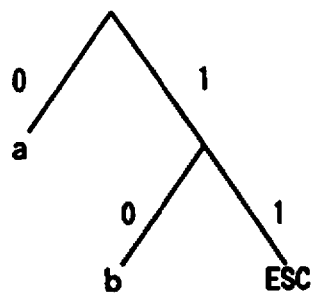
FIG. 6(a) shows the code tree of a second-order context.
Figure 6B:
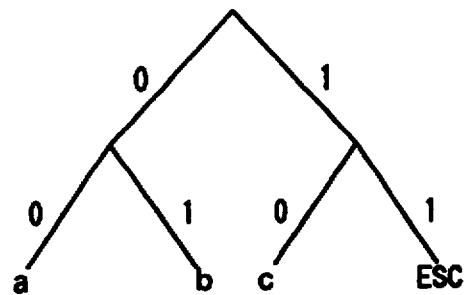
FIG. 6(b) shows the code tree of a first-order context.
Figure 6C:
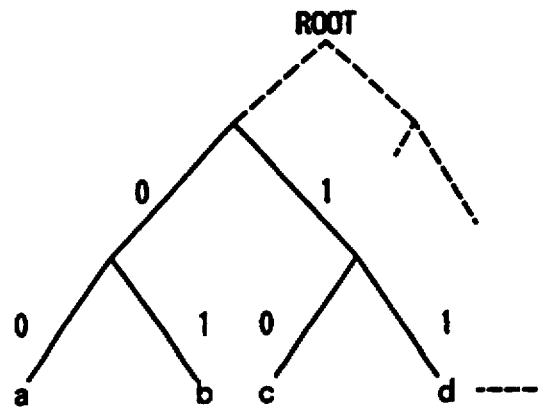
FIG. 6(c) shows a 0th-order context.

To begin with, FIG. 5(b) illustrates the code tree used for the conventional blending splay coding. This code tree corresponds to a first-order context with the node (registered with the character B) of the index 1 in the context tree shown in FIG. 5(a) serving as a parent. ESC has a code of its own as in the case of a leaf (node with the index 7) of the context tree. The root of the code tree is obtained when searching the second-order context BA or BC. The number of the leaves of the code tree shows one-to-one correspondence with respect to the number of the node of the context tree.

Then, FIG. 22 illustrates a code tree used for the blending splay coding in the sixth embodiment. In this code tree, as in the context tree shown in FIG. 21(a), ESC has disappeared. Instead, in this code tree, a pointer for the child (right child) positioned rightward of the parent of ESC points the root of the code tree. On the other hand, with respect to the root of the code tree, an empty pointer for the parent points the parent of ESC.

Figure 23A:
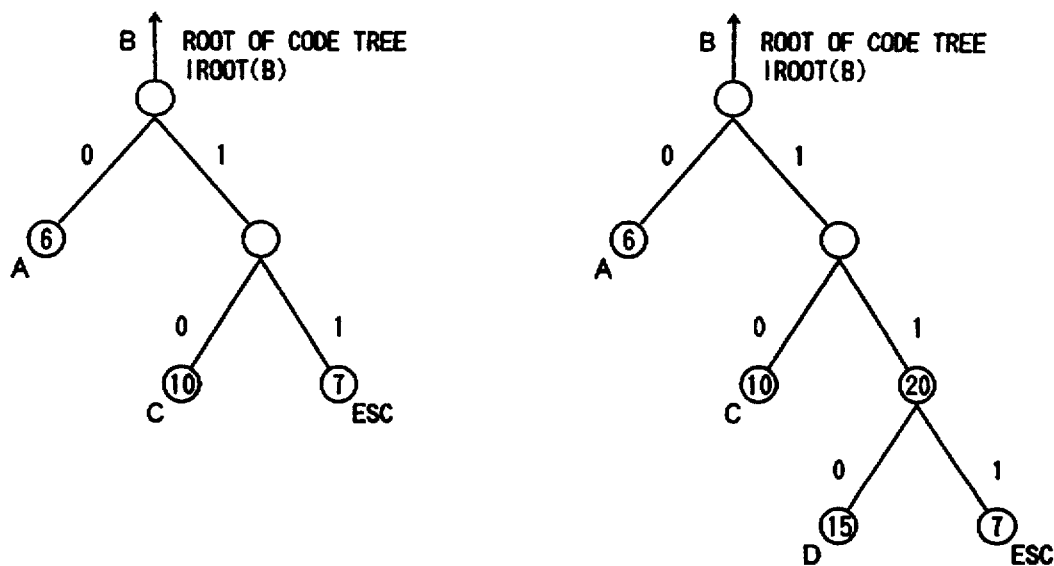
FIG. 23(a) shows the example of the new character registration by the conventional method.

Referring next to FIG. 23, there will be discussed a method of registering a new character in the blending splay coding in accordance with the sixth embodiment as well as in the conventional blending splay coding. This new character registering method is a method common to not only the coding but also the decoding. As illustrated in FIG. 23(a), according to the new character registering method in the conventional blending splay coding, two children are provided at the position of ESC, and one child is set as a new character, while the other character is set as ESC.

Figure 23B:
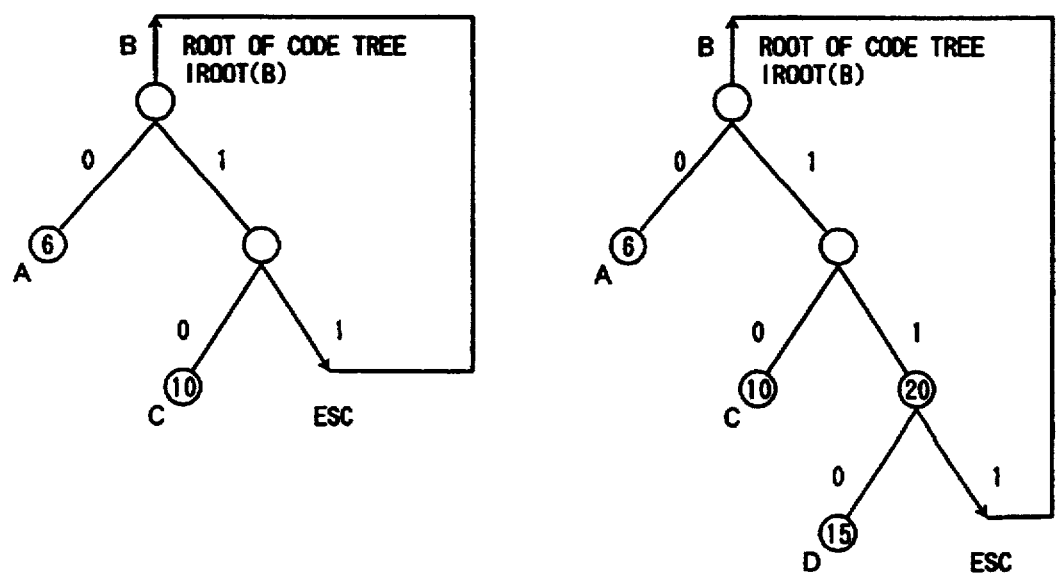
FIG. 23(b) shows the new character registration in the sixth embodiment.

On the other hand, as shown in FIG. 23(b), according to the new character registering method in the by lending splay coding in the sixth embodiment, because of the context tree having no ESC, a new node (with index 20) is provided under the node serving as a parent of ESC in the conventional method, and one child is set as a new character, while the other child points the root of the code tree. This eliminates the registration ESC in the code tree.

Figure 24:
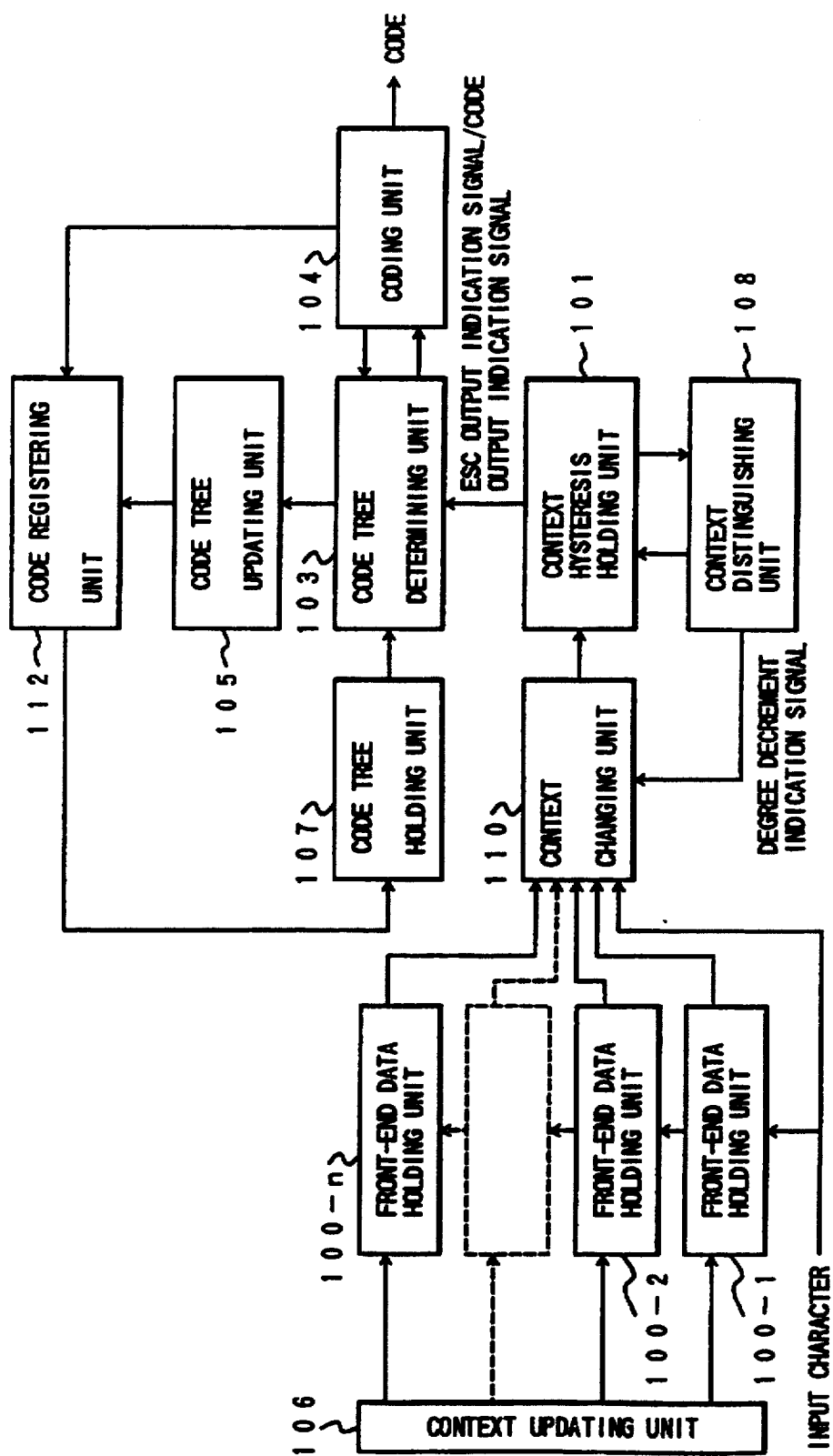
FIG. 24 is a block diagram illustrating a construction of a coding apparatus in the sixth embodiment.

Next, the data compressing apparatus will be described with reference to FIG. 24.

A context updating unit 106 updates the context on the basis of an input character that has already been encoded. Further, the context updating unit 106 outputs the thus updated context to front-end data holding units 100-1 through 100-n.

The front-end data holding units 100-1 through 100-n create a new context by adding the character encoded last time to the context updated by the context updating unit 106. Further, the front-end data holding units 100-1 through 100-n output the thus created context to a context changing unit 110.

A context hysteresis holding unit 101 examines whether or not a target character exists in the children of the context outputted from the context changing unit 110. A determination as to whether the target character exists or not is made by a context distinguishing unit 108. Also, the context hysteresis holding unit 101 includes a table (see FIG. 21(b)) for storing two pieces of data about the [root of the code tree corresponding to the second coding (decoding) process target context indicated by the node] and the [root of the code tree corresponding to the coding (decoding) process target context conceived as a parent of the node] with respect to the nodes.

Further, the context hysteresis holding unit 101 executes a process (termed a process A) of outputting, if the code allocated with a coding target character is not found out in the table, an ESC output indication signal for indicating an output of ESC in the code tree corresponding to the present context to a code tree determining unit 103.

When the ESC output indication signal is outputted to the code tree determining unit 103, the context distinguishing unit 108 carries out a process (termed a process B) of outputting an order decrement indication signal for indicating a decrement in the order of the context to the context changing unit 110.

The processes A and B are repeated till the code allocated with the coding target character is found out in the table.

On the other hand, if the node allocated with the coding target character is not found in the table, the context hysteresis holding unit 101 outputs a code output indication signal for indicating an output of the code of the coding target character by use of the code tree corresponding to the present context to the code tree determining unit 103.

The code tree determining unit 103, when inputting the code output indication signal, inputs the code tree corresponding to the present context from the code tree holding unit 107.

A coding unit 104 calculates the code from a structure of the code tree and outputs the thus calculated code.

A code tree updating unit 105 reorganizes the code trees.

The context hysteresis holding unit 101 and a code registering unit 112 register a coding target character in the context with ESC being encoded last.

Figure 25:
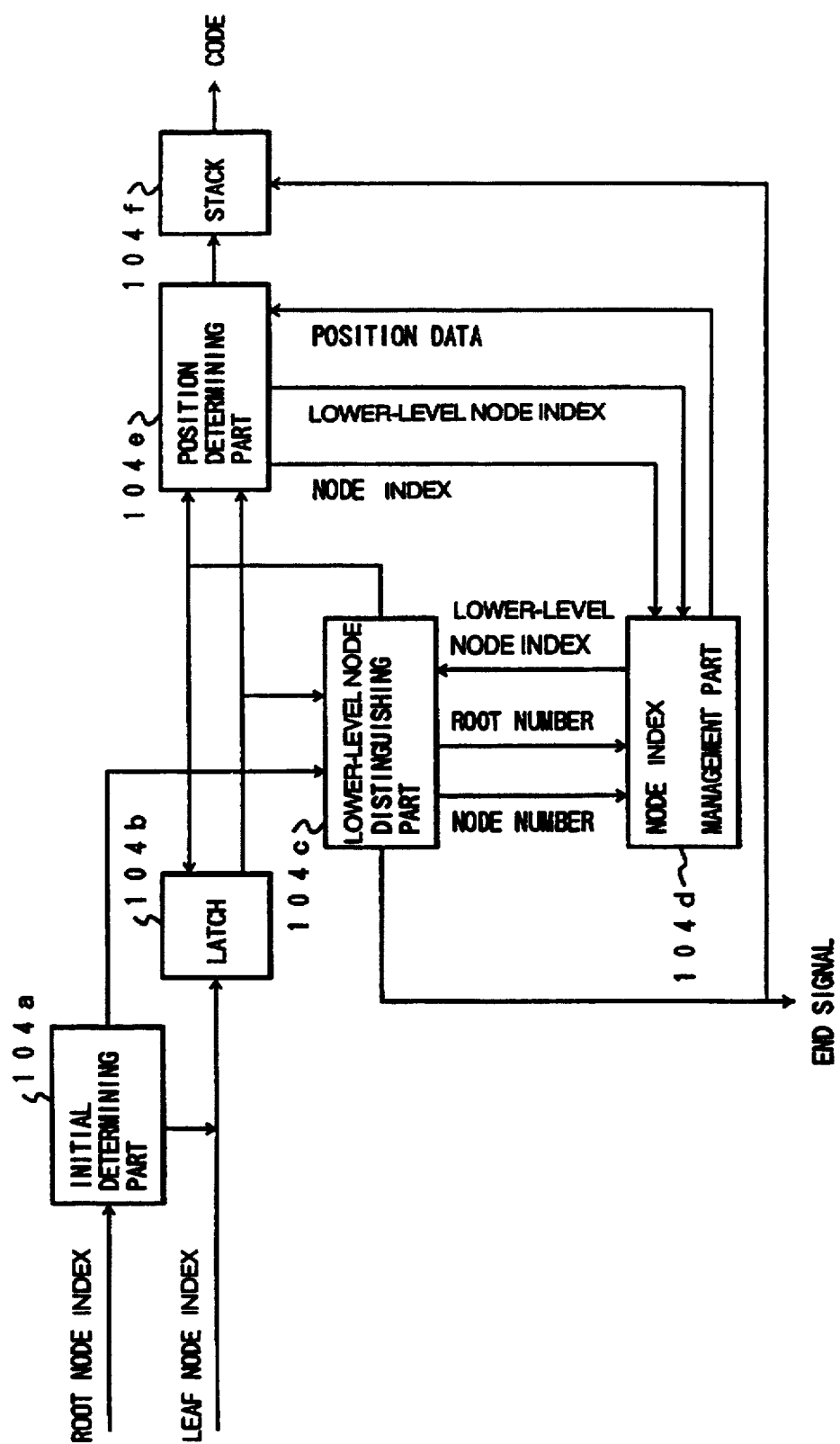
FIG. 25 is a block diagram illustrating a detailed configuration of an encoding unit of the encoding apparatus in the sixth embodiment.

Next, a detailed configuration of the coding unit 104 will be explained with reference to FIG. 25. A root reference index and a leaf reference index are inputted to the coding unit 104.

An initial determining part 104a, when encoding ESC, outputs an index different from the one of a normal leaf as a leaf index allocated to ESC. This is because there is originally no leaf index allocated ESC due to the fact that ESC is not defined as a original node.

A latch 104b latches the leaf index and outputs the latched leaf index to a lower-level node distinguishing part 104c.

A situation node determining part 104c compares the leaf index with the root index and determines whether or not it is a target node or whether the root is a leaf or not. If determined to be the root, an end signal is outputted. Whereas if not determined to be the root, the situation node determining unit 104c operates as follows.

That is, when coding ESC, the index different from the one of the normal leaf and the root index are outputted to a node index management part 104d. Further, in the case of encoding ESC, as illustrated in FIG. 22, tracing back to the root parent, there is conducted the same process as the normal leaf follows the lower level.

On the other hand, when encoding a character except for ESC, the normal node (leaf) index and "0" (in place of the root index) are outputted to the node index management part 104d.

The node index management part 104d outputs an index (simply referred to as a node number) allocated to the lower-level node to a lower-level node distinguishing part 104c. The outputted lower-level node index is latched by the latch 104b.

The target node index and the lower-level node index that remain latched by the latch 104b are outputted to a position determining part 104e. Further, the target node index and the lower-level node index are outputted via the position determining part 104e to the node index management part 104d.

The node index management part 104d outputs, to the position determining part 104e, a piece of position data indicating whether the target node is positioned leftward or rightward of the lower-level node on the basis of the target node index and the lower-level node index that are inputted from the position determining part 104e. Herein, if positioned leftward, the position data is "0". If positioned rightward, the position data is "1".

The position data is outputted via the position determining part 104e to a stack 104f.

The stack 104f manages the position data by an unillustrated stack pointer and, when the end signal is outputted from the lower-level node distinguishing part 104c, fetch-outputs the output data managed hitherto.

Figure 26:
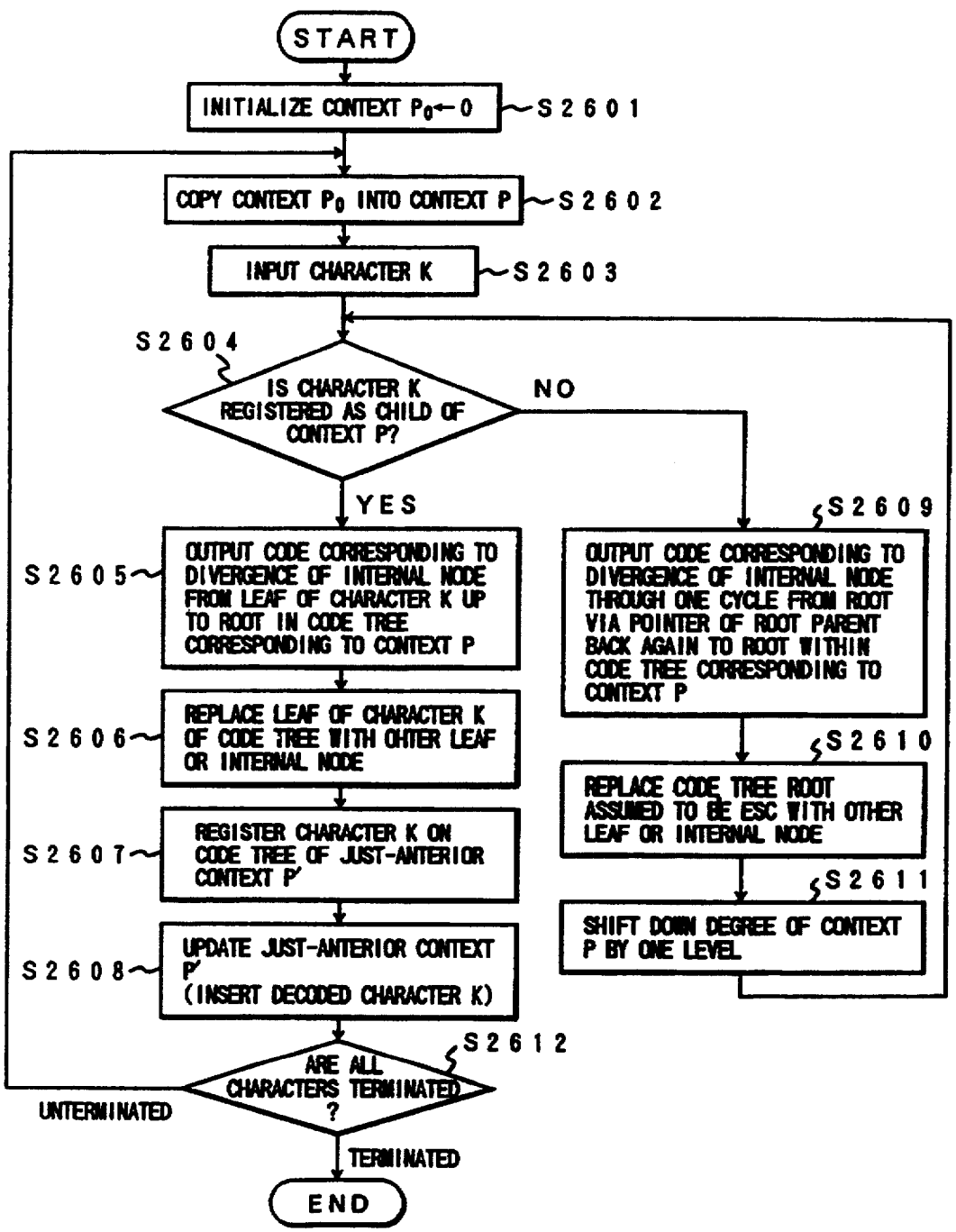
FIG. 26 is a processing flowchart showing an encoding process in the sixth embodiment.
Figure 27:
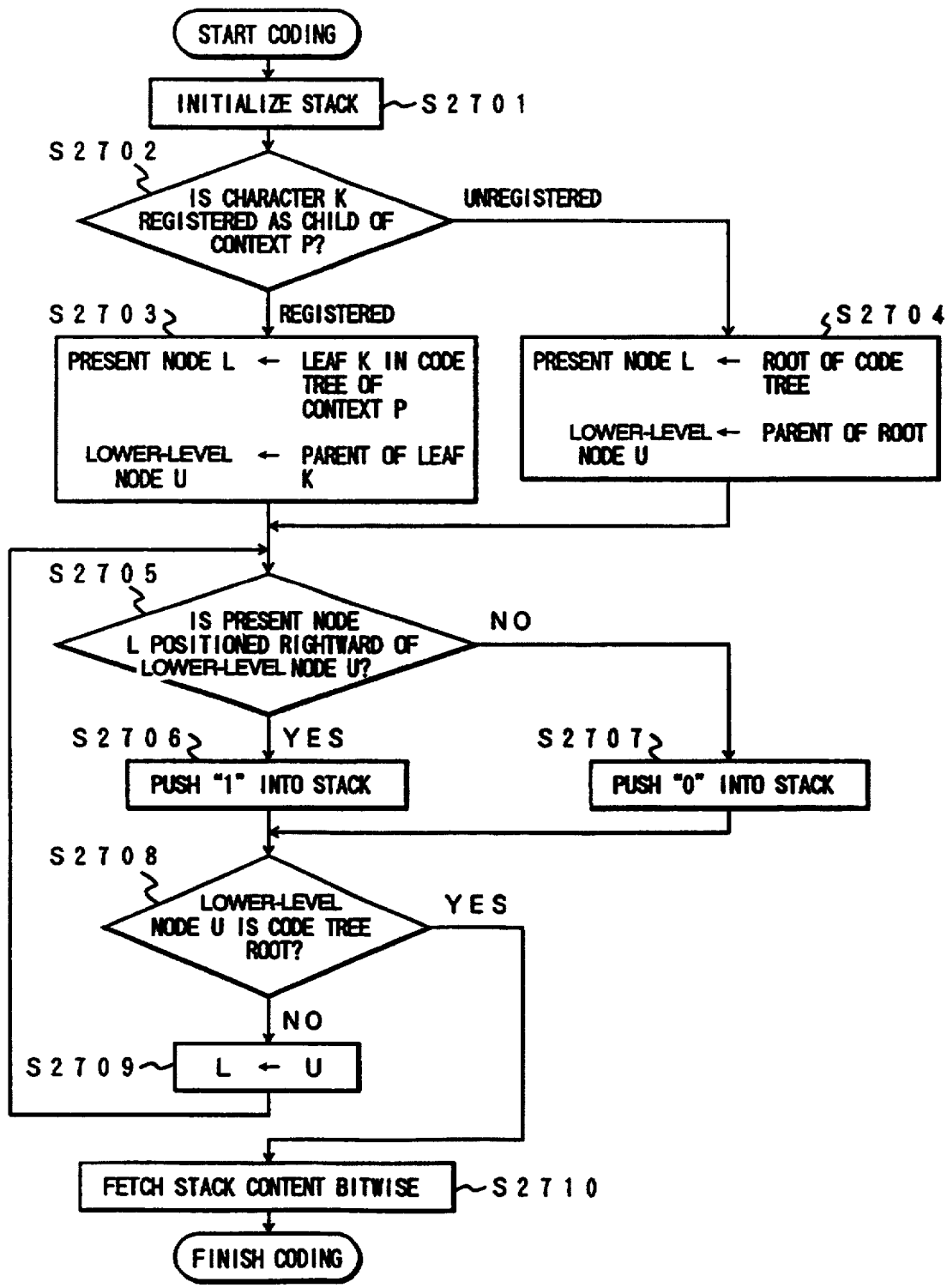
FIG. 27 is a detailed processing flowchart of FIG. 26, this processing flowchart corresponding to steps S2604, S2605 and S2609 in FIG. 26.

Next, a flow of the coding process will be described with reference to FIGS. 26 and 27.

At the first onset, $P_0$ representing a context is initialized (step S2601). The initialization herein implies the replacements of all the elements of the context $P_0$ with "0".

Then, the context $P_0$ is copied into the variable P representing the context (step S2602).

When the character K is inputted (step S2603), whether or not the character K is registered as a child of the context P is checked (step S2604).

If determined to be [registered] in step S2604, there is outputted the code corresponding to a divergence of an internal node to the root from a leaf of the character K in the code tree corresponding to the context P (step S2605).

Next, the leaf of the character K in the code tree is replaced with other leaf or an internal node (step S2606).

Then, the character K is registered in a code tree of context P', whose order is higher by 1 level than context P (step S2607).

Subsequently, the context P' is updated by inserting the character K (step S2608).

Then, whether or not the encoding process of all the characters of the input data are terminated is checked (step S2612).

If determined to be [unterminated] in step S2612, the processing returns to step S2602.

In step S2612, if determined to be [terminated], the processing is ended.

On the other hand, if determined to be [unregistered] in step S2604, there is outputted the code corresponding to a branch of an internal node through one cycle back to the root via the pointer of the root's parent within the code tree corresponding to the context P (step S2619).

Next, it is assumed that the root of the code tree is ESC, and ESC is replaced with other leaf or an internal node (step S2610).

Then, the order of the context P is shifted down by one level (step S2611), and the processing returns to step S2604.

Next, a detailed processing flow corresponding to steps S2604, S2605 and S2609 will be explained with reference to FIG. 27.

To start with, the stack 104f is initialized (step S2701).

Checked next is whether or not the character K is registered as a child of the context P (step S2702).

If determined to be [registered] in step S2702, the leaf K within the code tree of the context P is set as a present node L, and a parent of the leaf K is set as a lower-level node U (step S2703).

Whereas if determined to be [unregistered] in step S2702, the root of the code tree is set as the present node L, and the root's parent is set as the lower-level node U (step S2704).

After executing the processes in steps S2703 and S2704, there is checked whether or not the present node L is positioned rightward of the high-order node U (step S2705).

If determined as to be [positioned rightward] in step S2705, "1" is intruded (pushed) into the stack 104f (step S2706).

If determined to be [non-positioned rightward] (=[positioned leftward]) in step S2705, "0" is intruded (pushed) into the stack 104f (step S2707).

After carrying out the processes in steps S2706 and S2707, whether the lower-level node U is the root of the code tree or not is checked (step S2708).

If determined to be a [non-root] in step S2708, the lower-level node U is set as the present node L (step S2709), and the processing returns to step S2705.

Whereas if determined to be the [root] in step S2708, contents of the stack 104f are fetched bitwise and then outputted (step S2710), the processing is ended.

(Seventh Embodiment)

A seventh embodiment is concerned with a data decoding method and a data decoding apparatus for decoding a code compressed by the method discussed in the sixth embodiment.

Figure 28:
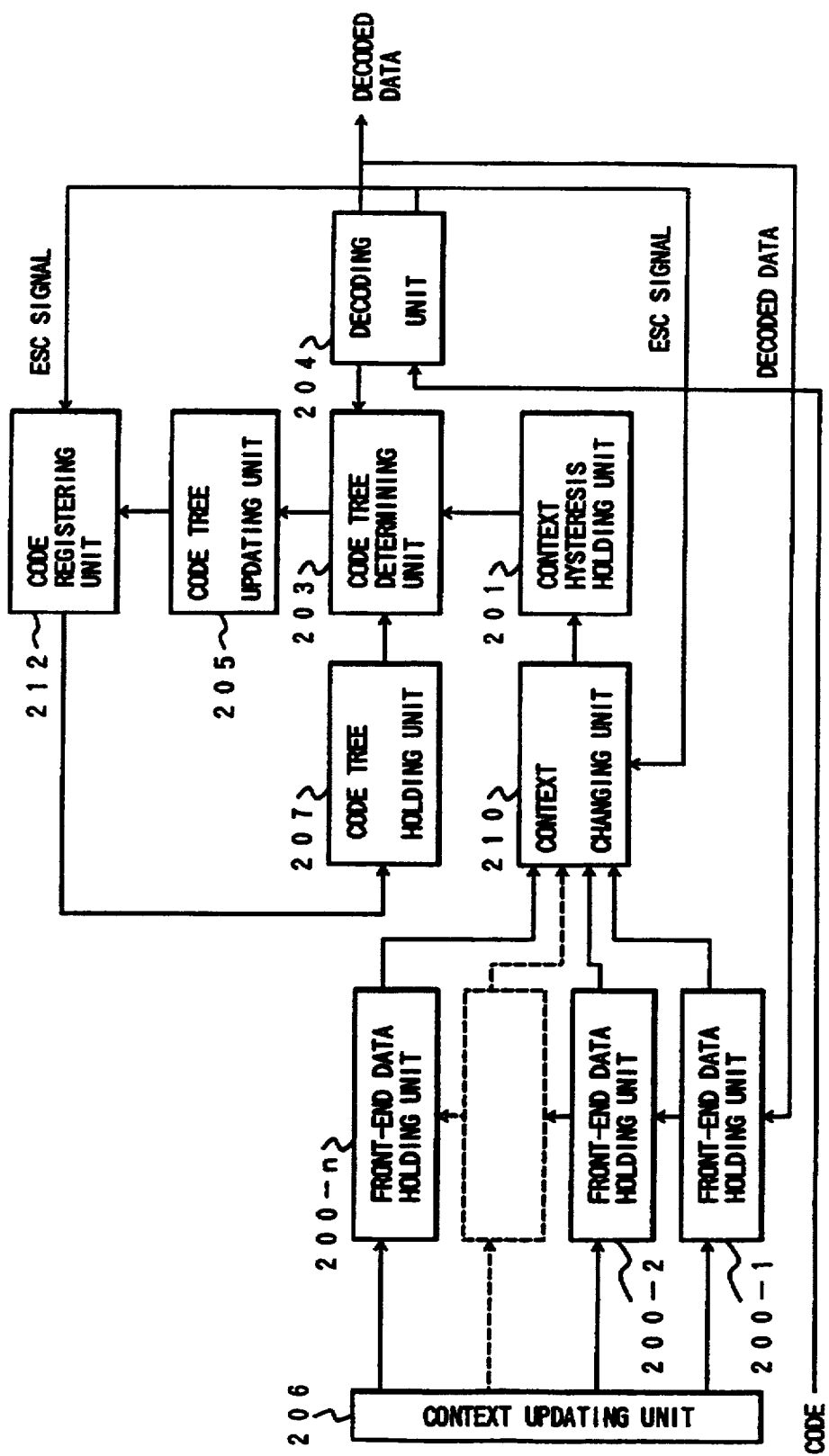
FIG. 28 is a block diagram illustrating a construction of a decoding apparatus in a seventh embodiment.

To start with, the data decoding apparatus will be described with reference to FIG. 28.

A context updating unit 206 updates the context on the basis an input character that has already been decoded. Further, the context updating unit 206 outputs the thus updated context to front-end data holding units 200-1 through 200-n.

The front-end data holding units 200-1 through 200-n create a new context by adding the character decoded the last time to the context updated by the context updating unit 206. Further, the front-end data holding units 200-1 through 200-n output the thus created context to a context changing unit 210.

A context hysteresis holding unit 201 obtains a root of the code tree corresponding to the context by making use of a piece of data of a [there of the code tree, corresponding to the second encoding (decoding) process target context, while the node represents] as one of columns of the table shown in FIG. 21(b). Further, the context hysteresis holding unit 201 output the thus obtained code tree root to a code tree determining unit 203.

The code tree determining unit 203 inputs a code tree corresponding to the present context from a code tree holding unit 207.

A decoding unit 204 performs a process of decoding the character by tracing the code tree from its root, a process of outputting the decoded character in the form of decoded data and a process of outputting, when the decoded character is ESC, an order decrement indication signal for indicating a decrement of the order of the context to a context changing unit 210 (a series of processes given above are called a process C).

A code tree updating unit 205 executes a process (termed a process D) of reorganizing the code trees.

The processes C and D are repeated till the character is decoded.

The context hysteresis holding unit 201 and a code registering unit 212 register a target character in the context whose order is higher by 1 level than the context with the character decoded.

Figure 29:
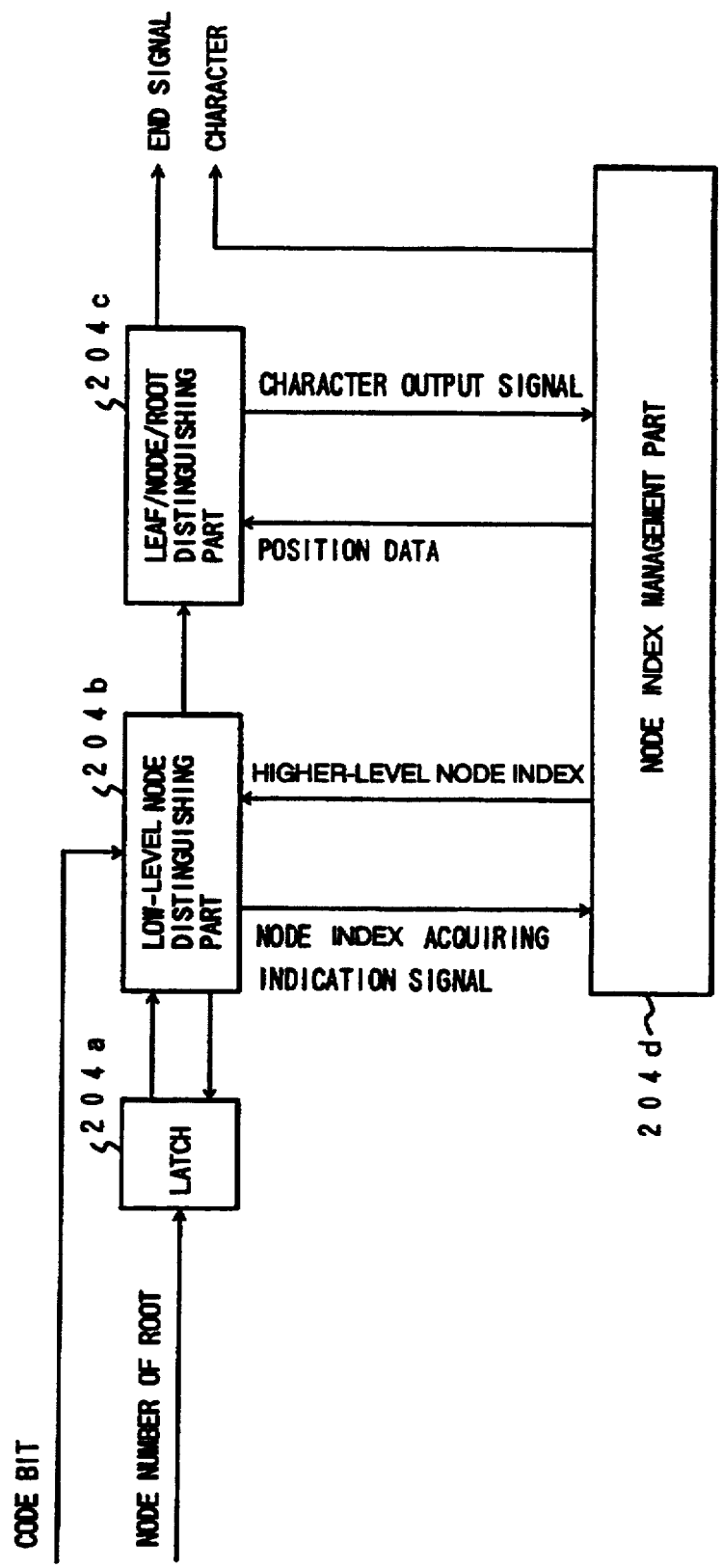
FIG. 29 is a block diagram illustrating a detailed configuration of a decoding unit of the decoding apparatus in the seventh embodiment.

Next, a detailed configuration of the decoding unit 204 will be explained with reference to FIG. 29. A root index and a code bit (expressed in a bit format) are inputted to the decoding unit 204.

A latch 204a latches the root index and outputs the latched root index to a higher-level node distinguishing part 204b.

The higher-level node distinguishing part 204b inputs the code bit and determines whether the node corresponding to the code bit is positioned leftward or rightward of a lower-level node (target node) which is at first the root and whose index has been latched at a latch 204a. Further, the higher-level node distinguishing part 204b outputs, to a node index management part 204d, a node index acquiring indication signal for indicating an acquirement of the index (higher-level node number) possessed by a child positioned leftward or rightward of the target node.

The node index management part 204d, when the node number acquiring indication signal is inputted, obtains a higher-level node index and outputs the thus obtained higher-level node index to the higher-level node distinguishing part 204b. Further, the node index management part 204d outputs, to a root/node/leaf distinguishing part 204c, a piece of position data for indicating whether the higher-level node is an internal node or a leaf.

The higher-level node index obtained in the node index management part 204d is, after being latched by the higher-level node distinguishing part 204b, outputted to the root/node/leaf distinguishing part 204c.

The root/node/leaf distinguishing part 204c, if the higher-level node is the leaf, outputs a character output signal to the node index management part 204d and also outputs the end signal. The root/node/leaf distinguishing part 204c, if the higher-level node is the internal node but the root, executes an operation and, if the higher-level node is the root registered with ESC, outputs the end signal only.

The node number management part 204d, when the character output signal is inputted from the root/node/leaf distinguishing part 204c, outputs a character.

Figure 30:
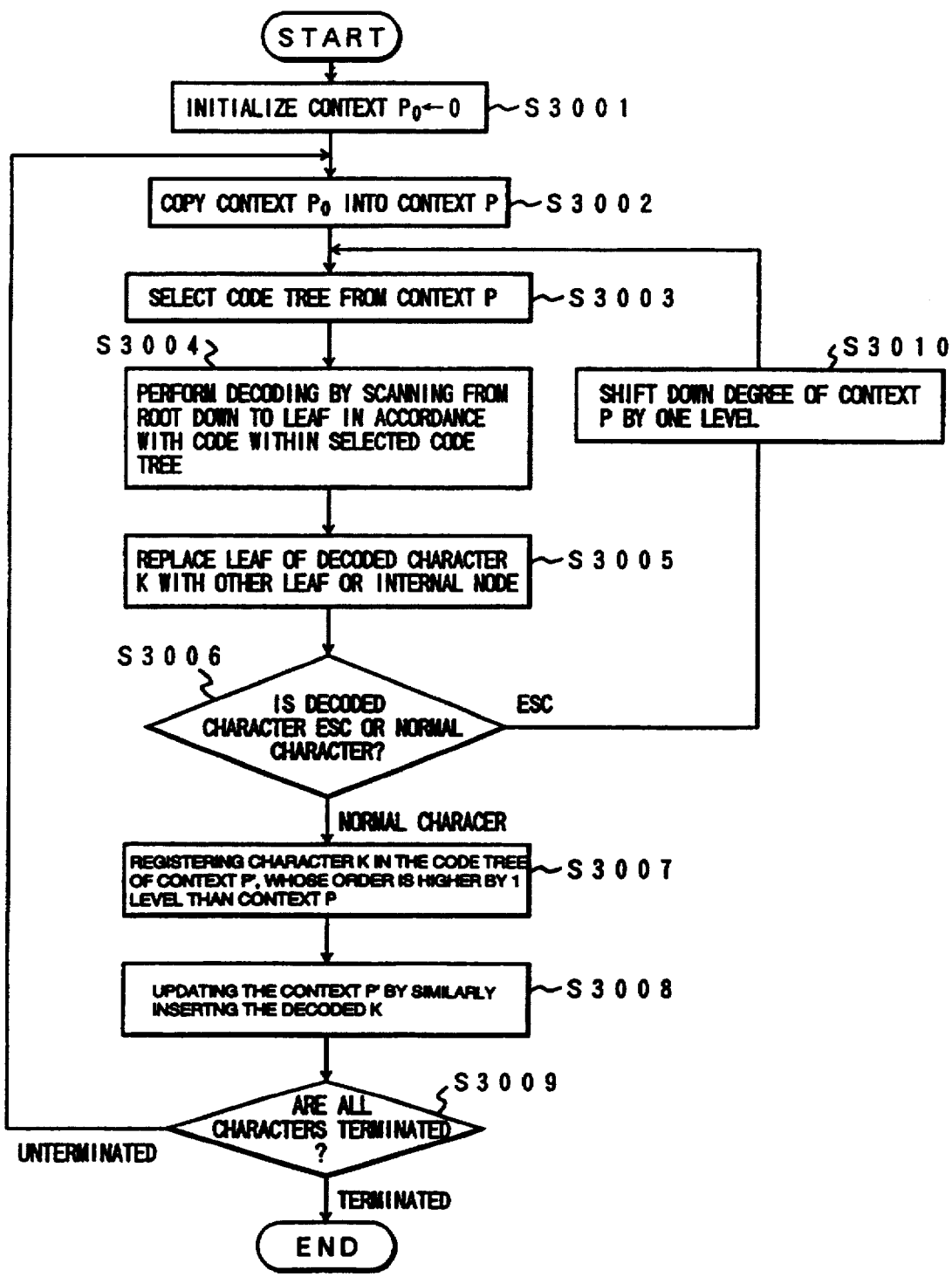
FIG. 30 is a processing flowchart of a decoding process in the seventh embodiment.
Figure 31:
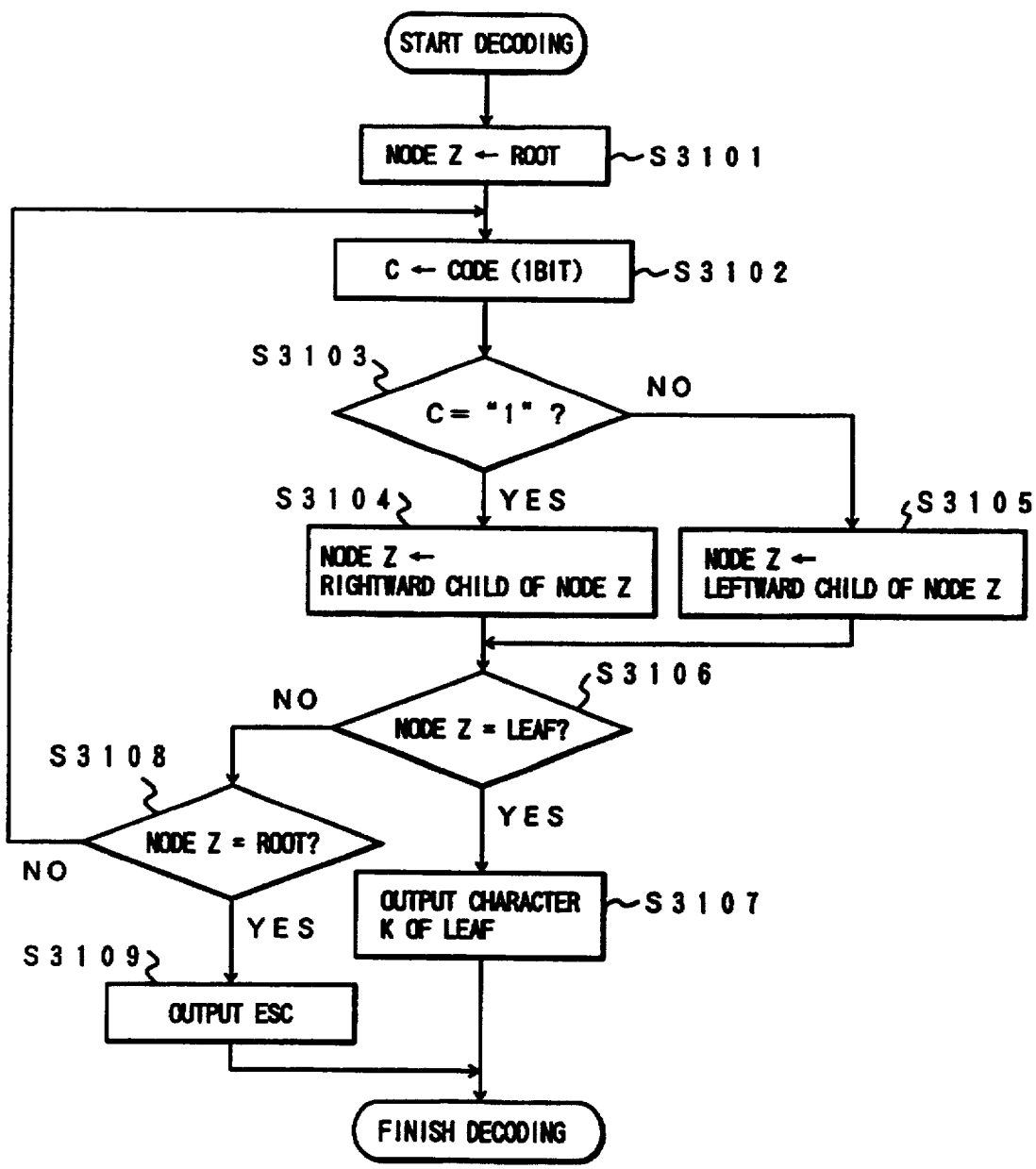
FIG. 31 is a detailed processing chart of FIG. 30, this processing flowchart corresponding to step S3004 of FIG. 30.

Next, a flow of the decoding process will be discussed with reference to FIGS. 30 and 31.

To begin with, $P_0$ representing a context is initialized (step S3001). The initialization herein implies the replacements of all the elements of the context $P_0$ with "0".

Then, the context $P_0$ is copied into the variable P representing the context (step S3002).

Subsequently, a code tree is selected from the context P (step S3003).

Then, decoding is effected by scanning from the root down to the leaf in accordance with the code within the selected code tree (step S3004).

Subsequently, a leaf of K representing the decoded character is replaced with other leaf or an internal node (step S3005).

Checked herein is whether the decoded character is ESC or a normal character (step S3006).

If determined to be [ESC] in step S3006, the order of the context P is shifted down by one level (step S3010), and the processing goes back to step S3003.

If determined to be the [normal character] in step S3006, the character K is registered in the code tree of context P' whose order is higher by 1 level than context P (step S3007).

Then, the context P' is updated by similarly inserting the decoded K (step S3008).

Subsequently, whether the decoding process of all the characters of the original data has been terminated or not is checked (step S3009).

If determined to be [unterminated] with respect to all the characters in step S3009, the processing returns to step S3002.

If determined to be [terminated] with respect to all the characters in step S3009, a series of processes are ended.

Next, a flow of detailed decoding process will be explained with reference to FIG. 31.

First, a node Z is set as a root (step S3101).

Then, a 1-bit code is substituted into a variable C (step S3102).

Subsequently, whether a value of C is 1 or not is checked (step S3103).

If determined to be [1] as the C's value in step S3103, a child positioned rightward of the node Z is set as the node Z (step S3104).

Whereas if determined not to be [1] as the C's value in step S3103, a child positioned leftward of the node Z is set as the node Z (step S3105).

After steps S3104 and S3105, whether the node Z is a leaf or not is checked (step S3106).

If the determination is that the node Z is the leaf in step S3106, the character K registered in the leaf is outputted (step S3107), and the processing is ended.

If the determination is that the node Z is not the leaf in step S3016, whether the node Z is a root or not is checked (step S3108).

If the determination is that the node Z is the root in step S3108, ESC is outputted, and the processing comes to an end (step S3109).

If the determination is that the node Z is not the root in step S3108, the processing returns to step S3102.

It is apparent that, in this invention, a wide range of different working modes can be formed based on the invention without deviating from the spirit and scope of the invention. This invention is not restricted by its specific working modes except being limited by the appended claims.

What is claimed is:

1. A data compressing method comprising:

a data string new registering step of, when a character and a context occur a first time, newly registering the character and the context, occurring for the first time, in a data string registering unit;

a code information new registering step of, when the character and the context occur a second time, newly registering coding information into the code for the current character following the context in the code information registering unit;

a code outputting step of outputting the code following the code information registered in the code information registering unit; and a code information updating step of updating the code information registering unit.

2. A data compressing method according to claim 1, wherein the frequency of the data string is monitored up a fixed number, and only the coding information of the current character following the context registered when the frequency exceeds the predetermined number is newly registered in the code information new registering step.

3. A data compressing method according to claim 2, wherein if said code information registering unit is constructed of a code tree having a binary tree structure, leaves of the code tree are set as data while paths extending from the root of the code tree down to the respective leaves are set as codes, in said code information updating step, the code tree is updated by exchanging a node's child, wherein the node is the path of root and current data's leaf, the code information is registered in the new leaf obtained by diverging the leaf of the code tree in said code information new registering step, and the leaf of the code tree is deleted together with the diverging node positioned closer by one path to the root in said data string/code information deleting step.

4. A data compressing method according to claim 2, wherein the code information registered in said code information registering unit is coded by an arithmetic coding method.

5. A data compressing method according to claim 1, wherein if said code information registering unit is constructed of a code tree having a binary tree structure, leaves of the code tree are set as data while paths extending from the root of the code tree down to the respective leaves are set as codes, in said code information updating step, the code tree is updated by exchanging a node's child, wherein the node is the path of root and current data's leaf, the code information is registered in the new leaf obtained by diverging the leaf of the code tree in said code information new registering step, and the leaf of the code tree is deleted together with the diverging node positioned closer by one path to the root in said data string/code information deleting step.

6. A data compressing method according to claim 1, wherein the code information registered in said code information registering unit is coded by an arithmetic coding method.

7. A data compressing method according to claim 6, wherein said data string/code information deleting step includes:

a deletion determining step of determining whether or not the data string registered in said data string registering unit and the coding information registered in said code information registering unit are deleted;

a deleting target selecting step of selecting, when determining that the deletion thereof is carried out in said deletion executing determining step, the data string to be deleted and the coding information to be deleted;

a deleting step of deleting the data string and the coding information that are selected in said deleting target selecting step respectively from said data string registering unit and said code information registering unit; and an updating-for-deletion step of updating said code information registering unit after being deleted in said deleting step, said updating-for-deletion step involving dividing the number occurrences of the code information by a multiple of 2 and setting, when a divided value is 1 or smaller, the number of occurrence to 1.

8. A data compressing method comprising:

a data string new registering step if, when a character and a context occur a first time, newly registering the current character and the context occurring for a first time, in a data string registering unit;

a code information new registering step of, when the character and the context occur a second time, newly registering coding information into the code for the current character following the context in said code information registering unit;

a code outputting step of outputting the code following the code information registered in said code information registering unit;

a code information updating stop of updating said code information registering unit; and a data string/code information deleting step of deleting the data string registered in said data string registering unit and deleting the code information registered in said code information registering unit, the data string/code information deleting step carried out at one of:

(i) each time a count value exceeds a fixed quantity, the count value obtained by counting an accumulation value of a capacity of the new input data;

(ii) monitoring a data compression ratio and carrying out the data string/code information deleting step when the monitored data compression ratio becomes worse;

(iii) when making a new registration and a total number of registrations in said data string registering unit exceeds a fixed number.

9. A data compressing method according to claim 8, wherein said data string/code information deleting step includes:

an initializing step of initializing the data string registered in said data string registering unit and the coding information registered in said code information registering unit, the initializing unit being carried out at one of:

(i) each time a count value exceeds a fixed quantity, the count value obtained by counting an accumulation value of a capacity of the new input data;

(ii) monitoring a data compression ratio and carrying out the initializing step when the monitored data compression ratio becomes worse; and (iii) when making a new registration and a total number of registrations in said data string registering unit exceeds a fixed number.

10. A data compressing method according to claim 8, wherein said data string/code information deleting step includes:

a deletion determining step of determining whether the data string registered in said data string registering unit and the coding information registered in said code information registering unit are deleted;

a deleting target selecting step of selecting, when determining that the deletion thereof is carried out in said deletion determining step, the data string to be deleted and the coding information to be deleted; and a deleting step of deleting the data string and the coding information that are selected in said deleting target selecting step from said data string registering unit and said code information registering unit.

11. A data compressing method according to claim 10, wherein in said deleting target selecting step, if said data string registering unit is viewed as a tree structure, all pointers pointing nodes defined as internal nodes of the tree and leaves as terminals of the tree are registered in a deleting rank list, and the data string and the coding information that are pointed by the pointers registered in a low rank in this deleting rank lists are deleted in said deleting step.

12. A data compressing method according to claim 11, wherein in said deleting target selecting step, the frequency of the pointer is monitored, and the pointer having a high frequencies registered in a high rank in said deleting rank list.

13. A data compressing method according to claim 10, wherein in said deleting target selecting step, if said data string registering unit is viewed as a tree structure, pointers pointing leaves as terminals of the tree are registered in one deleting rank list, and the data string and the coding information that are pointed by the pointers registered in a low order in the deleting rank list are deleted in said deleting step.

14. A data compressing method according to claim 13, wherein in said deleting target selecting step, the frequency of the pointer is monitored, and the pointer having a high frequencies registered in a high rank in said deleting rank link.

15. A data compressing method according to claim 10, wherein in said deleting target selecting step, if said data string registering unit is views as a tree structure, pointers pointing internal nodes of the tree are registered in on deleting rank list, and the data string and the coding information that are pointers registered in a low rank deleted in said deleting step.

16. A data compressing method according to claim 15, wherein in said deleting target selecting step, the frequency of the pointer is monitored, and the pointer having a high frequencies registered in a high rank in said deleting rank link.

17. A data compressing method according to claim 10, wherein in said deleting target selecting step, the pointer corresponding to a newly registered leaf is registered in the highest rank in the deleting rank list, and the pointer corresponding to the context which has occured, the character and the context should be moved to the most significant of the deleting rank list.

18. A data compressing method according to claim 10, wherein in said deleting target selecting step, the pointer corresponding to a newly registered leaf is registered in the lowest rank in the deleting rank list, and the order in the deleting rank list of the pointer corresponding to the context which has occured, the character and the context should be halved.

19. A data compressing method according to claim 10, wherein in said deleting target selecting step, the order in the deleting rank list of the pointer corresponding to the context which has occured, the character and the context should be raised by one.

20. A data compressing method to claim 10, wherein in said target deleting step, when the frequency of a character and a context is less than the predetermined value, the set of the character and the context should be selected as a deleting data.

21. A data compressing method according to claim 10, wherein in said deleting target selecting step, when the frequency of a character and a context is less than the fixed value, the set of the character and the context should be selected as a deleting data.

22. A data compressing method according to claim 10, wherein in said deleting execution determining step, the number of registrations in said data string registering unit is monitored, when this number exceeds a fixed number on the occasion of a new registration, one of the deleting targets selected in said deleting target selecting step is deleted in said deleting step, and a new registration tuple is instead registered.

23. A data compressing method according to claim 10, wherein a half of the data strings registered in said data string registering unit are deleted in said deleting step.

24. A data compressing method according to claim 8, wherein said data string/code information deleting step includes:

a deleting target selecting step of selecting the data string to be deleted and the coding information to be deleted, when the number of registrations in said data string registering unit exceeds a fixed number on the occasion of a new registration, one of the deleting targets selected in said deleting target selecting step is deleted as well as registering a new registration tuple, and when a data compression ratio be worse, initialize the data string registered in said data string registering unit and the code information in said code information registering unit.

25. A data compressing method according to claim 8, wherein if said code information registering unit is constructed of a code tree having a binary tree structure, leaves of the code tree are set as data while paths extending from the root of the code tree down to the respective leaves are set as codes, in said code information updating step, the code tree is updated by exchanging a node's child, wherein the node is the path of root and current data's leaf, the code information is registered in the new leaf obtained by diverging the leaf of the code tree in said code information new registering step, and the leaf of the code tree is deleted together with the diverging node positioned closer by one path to the root in said data string/code information deleting step.

26. A data compressing method according to claim 8, wherein the code information registered in said code information registering unit is coded by an arithmetic coding method.

27. A data compressing method of compression by coding, with a limited kind of characters serving as a target, an input character in accordance with a context representing an already-occured character string, said method comprising:

a context dictionary registering step of registering a combination of a coding process target context with a coding target character conceived as a child thereof in a context dictionary;

a code table registering step of registering, in a code table, information when coding the coding target character registered in the context dictionary;

an order setting step of setting an order expressed by the number of characters contained in the context;

a registration determining step of determining whether the combination of the coding target character and the coding process target context having the set order is registered in the context dictionary;

an unoccured code registering step of registering, if there is no combination of the coding target character and the coding process target contact an unoccured code indicating an escape into a context having a lower order in a code table corresponding to the context of the set order;

an unregistered processing step of outputting, if the combination of the coding target character and the coding process target context is found to have been unregistered in said registration determining step, the unoccured code of the set order and also decreasing the set order by one level;

a repeating step of repeating said registration determining step, an additional registering step and said unregistered processing step till the combination of the coding target character and the coding process target context is found to be registered in said registration determining step;

a code outputting step of outputting, if the combination of the coding target character and the coding process target context is found to be registered in said registration determining step, a code corresponding to the coding target character from the code table; and an additional registering step of additionally registering the coding target character in the code table and the context dictionary having a order higher than the order of the coded character, wherein the unoccured code corresponds to the context having the set order.

28. A data compressing method according to claim 27, wherein the unoccured code in the code table has a relationship corresponding to a storage location in the code table, and when coding the unoccured character, the code corresponding to the storage location in the code table is outputted.

29. A data compressing method according to claim 27, wherein with respect to each combination of the coding target character and the coding process target context, there are registered a code table's storage location corresponding to the coding process target context and a code table's storage location corresponding to a second coding process target context generated by connecting the coding target character to the coding process target context, and when outputting the unoccured code relative to the second coding process target context, the code table's storage location corresponding to the second coding process target context is employed.

30. A data compressing method according to claim 27, wherein the context dictionary is constructed in the form of a context tree, and the code table is constructed in the form of a binary code tree.

31. A data compressing method according to claim 30, wherein a last branch among respective branches corresponding to the unoccured character in the code tree is connected to the root of the code tree, and when coding the unoccured character, the code corresponding to a divergence of each node is outputted through one cycle tracing a parent thereof from the root of the code tree back again to the root.

32. A data compressing method according to claim 30, wherein with respect to each combination of the coding target character and the coding process target context, there are registered a code tree root corresponding to the coding process target context and a code tree root corresponding to a second coding process target context generated by connecting the coding target character to the coding process target context, and when outputting the unoccured code relative to the second coding process target context, the code tree root corresponding to the second coding process target context is employed.

33. A data decompressing method of decompressing, with a limited kind of characters serving as a target, compressed data by coding an input character in accordance with a context representing an already-occured character string, said method comprising:

an order setting step of setting an order expressed the number of characters contained in the context;

a context dictionary registering step of registering, in a context dictionary, a combination of a decoded character and a context having a predetermined order;

a code table registering step of registering information for decoding in the code table independently for every decoded context;

a code table determining step of determining a code table corresponding to a decoding process target context of a predetermined order of the context decoded just anterior thereto;

an unoccured code registering step of registering, if the decoding target character is not registered in the decoding process target context of the set order, an unoccured code indicating an escape into a context of a lower order in the code table corresponding to the context of the set order;

a decompression processing step of decompressing the unoccured code of each order and decreasing the set order by one level till the character is decompressed;

a character outputting step of outputting, when the character is decompressed, a character corresponding to the code from the code table; and a decompressed character additional registering step of additionally registering, when the character is can be decompressed at a certain order, the decompressed character in the code table and the context dictionary of an order higher than the order of the decompressed character, wherein the unoccured code in the decoding process target context of the set order is made corresponding to the context of the set order.

34. A data decompressing method according to claim 33, wherein the unoccured code in the code table has a relationship corresponding to a storage location in the ode table, and the code corresponding to the storage location in the code table is decompressed as a unoccured character.

35. A data decompressing method according to claim 33, wherein in said context dictionary registering step, with respect to each combination of the decoding target character and the decoding process target context, there are registered a code table's storage location corresponding to the decoding process target context and a storage location for a second decoding process target context generated by connecting the decoding target character to the decoding process target context, and when decoding the second decoding process target context, the storage location for the second decoding process target context is employed.

36. A data decompressing method according to claim 33, wherein the context dictionary is constructed in the form of a context tree, and the code table is constructed in the form of a binary code tree.

37. A data decompressing method according to claim 36, wherein a last branch among respective branches corresponding to the unoccured codes in the code tree is connected to the root of the code tree, and when decoding the unoccured code, the code is determined as the unoccured code through one cycle tracing right and left children in accordance with a code bit from the root of the code tree back again to the root.

38. A data decompressing method according to claim 36, wherein with respect to each combination of the decoding target character and the decoding process target context, there are registered a code tree root corresponding to the decoding process target context and a code tree root corresponding to a second decoding process target context generated by connecting the decoding target character to the decoding process target context, and when decompressing the second decoding process target context, the code tree root corresponding to the second decoding process target context is employed.

39. A data compressing apparatus for executing a compression by coding, with a limited kind of characters serving as a target, an input character in accordance with a context representing an already-occured character string, said apparatus comprising:

a context dictionary registering unit for registering a combination of a coding process target context and a coding target character conceived as a child thereof in a context dictionary;

a code tree registering unit for registering, in a binary code tree, information when coding the coding target character registered in the context dictionary;

a order setting unit for setting a order expressed by the number of characters contained in the context;

a registration determining unit for determining whether or not the combination of the coding target character with the coding process target context having the set order is registered in the context dictionary;

an unoccured code registering unit for registering, if there is no combination of the coding target character with the coding process target context, an unoccured code indicating an escape into a context having a lower order as a root of the code tree corresponding to the context of the set order;

an unregistered processing unit for outputting, if the combination of the coding target character and the coding process target context is found to be unregistered in said registration determining unit, the unoccured code of the set order and also decreasing the set order by one level;

a repeating unit for repeating the processes conducted in said registration determining unit, an additional registering unit and said unregistered processing unit till the combination of the coding target character and the coding process target context is found to be registered in said registration determining unit;

a code outputting unit for outputting, if the combination of the coding target character and the coding process target context is found to be registered in said registration determining unit, codes corresponding to divergences of nodes from a root of the code tree down the leaf stored with the coding target character; and a coding target character additional registering unit for additionally registering the coding target character in the code tree and the context dictionary having an order higher than the order at which the combination is found to be registered, wherein said context dictionary registering unit allocates a univocal identifier to the context to be registered, said code tree registering unit allocates a univocal identifier to the root of the code tree, and said unoccured code registering unit allocates, to the unoccured code, an identifier coincident with the identifier allocated in said context dictionary registering unit and with the identifier allocated in said code tree registering unit.

45

40. A data compressing apparatus according to claim 39, wherein said code outputting unit determines whether the coding target character is a unoccured character or an ordinary character and, when said initialization determining unit determines that the character is the unoccured character, searches a node of the code tree through one cycle tracing a parent thereof from the root of the code tree back again to the root.

41. A data compressing apparatus according to claim 39, wherein said context dictionary registering unit registers, with respect to each combination of the coding target character and the coding process target context, a code tree root corresponding to the coding process target context and a code tree root corresponding to a second coding process target context generated by connecting the coding target character to the coding process target context, and.

when said code outputting unit outputs the unoccured code relative to the second coding process target context, the code tree root corresponding to the second coding process target context is employed.

42. A data decompressing apparatus for decompressing, with a limited kind of characters serving as a target, compressed data by coding an input character in accordance with a context representing an already-occured character string, said apparatus comprising:

an order setting unit for setting an order expressed the number of characters contained in the context;

a context dictionary registering unit for registering, in a context dictionary, a combination of a decoded character and a context having a predetermined order;

a code tree registering unit for registering information for decoding in a binary code tree independently for every decoded context;

a code tree determining unit for determining a code tree corresponding to a decoding process target context of a predetermined order composed of the characters decoded just anterior thereto;

an unoccured code registering unit for registering, if the decoding target character is not registered in the decoding process target context of the set order, an unoccured code indicating an escape into a context of a lower order as a root of the code tree corresponding to the context of the set order;

46 a context changing unit for repeating, after decompressing the escape code of each order, the decompressing process by decreasing the order of the decoding process target context till the character is decompressed;

a decoding unit for outputting the character after tracing branches of nodes in accordance with respective bits of the codes from the root of the code tree down to a leaf registered with the decoding target character; and a decompressed character registering unit for registering the decompressed character in the code tree and the context of a order higher than the order of the decompressed character, wherein said context dictionary registering unit allocates a univocal identifier to the context to be registered, said code tree registering unit allocates a univocal identifier to the root of the code tree, and said unoccured code registering unit allocates, to the unoccured code, an identifier coincident with the identifier allocated in said context dictionary registering unit and with the identifier allocated in said code tree registering unit.

43. A data decompressing apparatus according to claim 42, wherein said decoding unit, when decoding the unoccured code, identifies the code as the unoccured code by confirming one cycle tracing right an d left children in accordance with a code bit from the root of the code tree back again to the root.

44. A data decompressing apparatus according to claim 42, wherein said context dictionary registering unit registers, and respect to each combination of the decoding target character with the decoding process target context, a code tree root corresponding to the decoding process target context and a code tree root corresponding to a second decoding process target context generated by connecting the decoding target character to the decoding process target context, and said code outputting unit employs, when decoding relative to the second decoding process target context, the code tree root corresponding to the second decoding process target context.

* * * * *